(12) United States Patent
Saito et al.

(10) Patent No.: US 11,993,534 B2
(45) Date of Patent: May 28, 2024

(54) VOLATILIZATION SUPPRESSING COMPONENT, AND METHOD FOR MANUFACTURING SAME

(71) Applicant: FURUYA METAL CO., LTD., Tokyo (JP)

(72) Inventors: Shoji Saito, Tokyo (JP); Tomoaki Miyazawa, Tokyo (JP); Tomohiro Maruko, Tokyo (JP); Yuichi Iwamoto, Tokyo (JP); Atsushi Ito, Tokyo (JP)

(73) Assignee: FURUYA METAL CO., LTD., Tokyo (JP)

( * ) Notice: Subject to any disclaimer, the term of this patent is extended or adjusted under 35 U.S.C. 154(b) by 527 days.

(21) Appl. No.: 17/282,572

(22) PCT Filed: Sep. 27, 2019

(86) PCT No.: PCT/JP2019/038074
§ 371 (c)(1),
(2) Date: Apr. 2, 2021

(87) PCT Pub. No.: WO2020/071260
PCT Pub. Date: Apr. 9, 2020

(65) Prior Publication Data
US 2021/0347669 A1    Nov. 11, 2021

(30) Foreign Application Priority Data
Oct. 4, 2018  (JP) .................... 2018-189427

(51) Int. Cl.
*B32B 3/30* (2006.01)
*B05D 1/28* (2006.01)
(Continued)

(52) U.S. Cl.
CPC .................. *C03B 5/43* (2013.01); *B05D 1/28* (2013.01); *B05D 3/0272* (2013.01); *B05D 7/14* (2013.01);
(Continued)

(58) Field of Classification Search
CPC ....... C03B 5/43; C03B 5/1672; C03B 5/1675; B05D 1/28; B05D 3/0272; B05D 7/14;
(Continued)

(56) References Cited

U.S. PATENT DOCUMENTS 4,232,056 A * 11/1980 Grant .................. C23C 4/02
428/937
2005/0282034 A1   12/2005 Hayasaki et al.
2008/0090087 A1   4/2008  Shoji et al.

FOREIGN PATENT DOCUMENTS

EP   2692703    2/2014
JP   1-201033   8/1989
(Continued)

OTHER PUBLICATIONS

International Preliminary Report on Patentability dated Apr. 15, 2021 in corresponding International PCT Patent Application No. PCT/JP2019/038074, 11 pgs.
(Continued)

*Primary Examiner* — Megha M Gaitonde
(74) *Attorney, Agent, or Firm* — Ohlandt, Greeley and Perle, LLP

(57) ABSTRACT

The volatilization suppressing component according to the present disclosure has a metallic base material; and a laminated film having at least a first layer formed on a portion or the entirety of a surface of the metallic base material, and a second layer formed on the first layer, wherein the first layer
(Continued)

is an adhesive layer between the metallic base material and the second layer, and the second layer is a protective layer for the first layer.

12 Claims, 19 Drawing Sheets

(51) Int. Cl.
| | | |
|---|---|---|
| B05D 3/02 | (2006.01) | |
| B05D 7/14 | (2006.01) | |
| C03B 5/43 | (2006.01) | |
| C04B 35/488 | (2006.01) | |
| C04B 35/622 | (2006.01) | |
| C23C 28/04 | (2006.01) | |
| C23C 4/11 | (2016.01) | |
| C23C 4/134 | (2016.01) | |

(52) U.S. Cl.
CPC ...... *C04B 35/488* (2013.01); *C04B 35/62222* (2013.01); *C23C 28/042* (2013.01); *C04B 2235/3246* (2013.01); *C04B 2235/3427* (2013.01); *C04B 2235/5436* (2013.01); *C04B 2235/5445* (2013.01); *C04B 2235/5472* (2013.01); *C23C 4/11* (2016.01); *C23C 4/134* (2016.01)

(58) Field of Classification Search
CPC ............ C04B 35/488; C04B 35/62222; C04B 2235/3246; C04B 2235/3427; C04B 2235/5436; C04B 2235/5445; C04B 2235/5472; C23C 28/042; C23C 4/11; C23C 4/134; C23C 4/18; C23C 14/08; C23C 24/04; C23C 28/04; Y02P 40/57; B32B 15/04; B32B 15/06; C01G 25/02; Y10T 428/24174; Y10T 428/24479; Y10T 428/24521; Y10T 428/24595; Y10T 428/24612; Y10T 428/2462; Y10T 428/24942; Y10T 428/2495; Y10T 428/24967; Y10T 428/24992
USPC ......... 428/119, 156, 161, 17, 172, 173, 212, 428/213, 215, 218
See application file for complete search history.

(56) References Cited

FOREIGN PATENT DOCUMENTS

| | | |
|---|---|---|
| JP | 8-92719 | 4/1996 |
| JP | 2005-240171 | 9/2005 |
| JP | 2008-121073 | 5/2008 |
| JP | 2012-121740 | 6/2012 |
| JP | 2012-132071 | 7/2012 |
| JP | 2015-021144 | 2/2015 |
| WO | 2006/030738 | 3/2006 |
| WO | 2012/133107 | 10/2012 |

OTHER PUBLICATIONS

International Search Report dated Dec. 17, 2019 in corresponding International PCT Patent Application No. PCT JP2019/038074, 2 pgs.

* cited by examiner (a)

(b)

(c)

DOUBLE COAT: Example 3    THERMAL SPRAY COAT ONLY: Comparative Example 4
LIQUID COAT ONLY: Comparative Example 5    COATINGLESS: Comparative Example 6

VOLATILIZATION SUPPRESSING COMPONENT, AND METHOD FOR MANUFACTURING SAME

BACKGROUND

1. Field of the Disclosure

The present disclosure relates to a volatilization suppressing component and a method for manufacturing the same, and, for example, the present disclosure relates to a volatilization suppressing component having a laminated film in which detachment of a coating layer and propagation of cracks serving as an oxygen invasion route are not likely to occur, and a method for manufacturing a volatilization suppressing component, which improves productivity.

2. Discussion of the Background Art

Conventionally, the manufacture of high-quality glass such as glass for liquid crystal display or optical glass, or various single crystals such as oxide single crystals or halide single crystals is carried out in a high temperature range of 1200° C. or higher. Heat-resistant components used for the manufacture of these are usually formed of metals or oxides.

In a case where a heat-resistant component is formed of a metal, the metal is oxidized in an atmosphere in which oxygen is present in a high temperature range, and the strength is lowered due to oxidative deterioration and oxidative volatilization so that the product life is shortened.

Regarding the prevention of volatilization suppression, a method of forming a coating layer formed of stabilized zirconia by thermal spraying on the outer surface of a high-temperature device formed of a platinum group metal has been proposed (see, for example, Patent Literature 1). Here, the thickness of the coating layer is 50 to 500 μm.

Furthermore, a method of preventing volatilization suppression by forming an oxygen barrier film on the surface of a substrate of a heat-resistant component by going through the respective processes of application, drying, and calcination of a colloidal solution containing colloidal particles of an oxide, has been proposed (see, for example, Patent Literature 2). Here, the thickness of the oxygen barrier film is 20 to 800 nm.

Furthermore, in the field of semiconductors, a method of forming an yttria thermal-sprayed film and a physical vapor deposition (PVD) film as corrosion-resistant films and promoting corrosion prevention has been proposed (see, for example, Patent Literature 3).

PRIOR ART DOCUMENTS

Patent Document

Patent Document 1: JP 2012-132071 A
Patent Document 2: JP 2015-21144 A
Patent Document 3: JP 2005-240171 A

SUMMARY

However, in the method described in Patent Literature 1, during the cycle of temperature rise and temperature drop, there is a problem that due to the difference in the coefficient of thermal expansion between the metal portion of the outer surface of a high-temperature device, which corresponds to a heat-resistant component, and the stabilized zirconia of the coating layer, detachment and cracking of the coating layer occur in some parts. Here, the problem of the occurrence of detachment can be solved by improving the fixing strength between the outer surface and the coating layer of the high-temperature device by a surface treatment such as blasting, cleaning, and a chemical treatment; however, a method of preventing the occurrence of cracking is not available at the moment. As oxygen reaches the outer surface of the high-temperature device due to cracking, oxidative deterioration and oxidative volatilization of the metal forming the high-temperature device occur, and the effect as an oxygen barrier layer becomes insufficient.

Furthermore, in the method described in Patent Literature 2, since the oxygen barrier film is a porous film, oxygen easily penetrates, and the film is insufficient for suppressing oxidative volatilization. Furthermore, since the oxygen barrier film is a porous film, the contact area with the substrate is small, cracks are easily occurred between the surface of the substrate and the oxygen barrier film, and the oxygen barrier film is likely to be peeled off. As oxygen reaches the surfaces of the substrate as a result of porosity and detachment, oxidative deterioration and oxidative volatilization of the metal forming the surface of the substrate occur, and the effect as an oxygen barrier film becomes insufficient.

In order to solve the above-described problems, a film that is as dense as possible should be produced. As a means for producing this film, there is available the technology for forming a multilayer of a thermally sprayed film and a PVD film as described in Patent Literature 3; however, the manufacturing cost is high, production of films into large-sized products and products having special shapes is difficult, and it is difficult to employ the technology from the viewpoint of manufacture. As such, there is no means for solving all of the problems such as prevention of cracking and detachment of a coating layer, prevention of oxidative volatilization concomitant with this cracking and detachment, and high productivity.

Thus, an object of the present disclosure is to provide a volatilization suppressing component in which detachment of a coating layer and propagation of a crack as an oxygen invasion route are not likely to occur, and a method for manufacturing a volatilization suppressing component with improved productivity.

The inventors of the present disclosure conducted a thorough investigation in order to solve the above-described problems, and as a result, the inventors found that the above-described problems can be solved when a laminated film of an adhesive layer and a protective layer is formed, and the protective layer prevents the propagation of a crack from the adhesive layer at the time of use, thus completing the present disclosure.

The volatilization suppressing component according to the present disclosure has a metallic base material; and a laminated film having at least a first layer formed on a portion or the entirety of a surface of the metallic base material, and a second layer formed on the first layer, wherein the first layer is an adhesive layer between the metallic base material and the second layer, and the second layer is a protective layer for the first layer.

With regard to the volatilization suppressing component according to the present disclosure, it is preferable that the first layer is denser than the second layer. In the laminated film, an oxygen invasion route is not likely to be occurred.

With regard to the volatilization suppressing component according to the present disclosure, it is preferable that the first layer is a dense adhesive layer having an average porosity of less than 10%, and the second layer is a porous protective layer having an average porosity of 10% or higher and 50% or lower. Adhesiveness between the metallic base material and the first layer is further enhanced, and it is more difficult for the crack occurred in the first layer to be propagated to the second layer.

With regard to the volatilization suppressing component according to the present disclosure, it is preferable that an average particle size in the first layer is larger than an average particle size in the second layer. The crack occurred in the first layer is not easily propagated to the second layer, and deformation of the first layer is suppressed.

With regard to the volatilization suppressing component according to the present disclosure, it is preferable that the average particle size in the first layer is more than 2 μm and 20 μm or less, and the average particle size in the second layer is 0.5 μm or more and 2 μm or less. The adhesiveness between the metallic base material and the first layer is further enhanced, it is more difficult for the crack occurred in the first layer to be propagated to the second layer, and deformation of the first layer is further suppressed.

With regard to the volatilization suppressing component according to the present disclosure, it is preferable that an average thickness of the first layer is 50 μm or more and 150 μm or less, and an average thickness of the second layer is 30 μm or more and 65 μm or less. An oxygen barrier is secured by the laminated film, and the number of occurrences of the crack is reduced.

With regard to the volatilization suppressing component according to the present disclosure, it is preferable that the metallic base material has anchors at a vertical cross-section representing a thickness of the base material, and an average cross-sectional area per anchor is 300 μm$^2$ or more. Here, the anchors are recesses formed on the outer surface of the metallic base material. As coating particles penetrate into the anchors of the metallic base material, a fixing strength between the first layer and the metallic base material is increased.

With regard to the volatilization suppressing component according to the present disclosure, it is preferable that in the vertical cross-section, constituent particles of the first layer occupy 85% or more of the cross-sectional area of the anchors. The fixing strength between the first layer and the metallic base material is increased.

With regard to the volatilization suppressing component according to the present disclosure, it is preferable that the laminated film is an oxide containing any one element of zirconium, silicon, aluminum, hafnium, calcium, magnesium, beryllium, thorium, or yttrium as a main component, or a composite oxide of these. Oxidative deterioration and oxidative volatilization of the metal forming the metallic base material can be further suppressed.

With regard to the volatilization suppressing component according to the present disclosure, it is preferable that the first layer and the second layer contain the same oxide as a main component. Coefficients of thermal expansion of the first layer and the second layer become close together, and the occurrence of the crack or detachment can be further suppressed.

With regard to the volatilization suppressing component according to the present disclosure, it is preferable that a material of the metallic base material is platinum, a platinum alloy, iridium, or an iridium alloy. The material of the metallic base material can be selected in accordance with purity and quality of an intended manufactured product.

A method for manufacturing a volatilization suppressing component according to the present disclosure is a method for manufacturing the volatilization suppressing component according to the present disclosure, the method having a step of forming the first layer on the surface of the metallic base material by a thermal spraying method; and a step of forming the second layer by performing, at least once, a process of forming a liquid layer on a surface of the first layer and of drying and solidifying the liquid layer.

With regard to the method for manufacturing the volatilization suppressing component according to the present disclosure, it is preferable that, in the step of forming the second layer, a colloidal solution layer is formed at least once as the liquid layer. The manufacturing cost becomes highly inexpensive, the liquid layer can be easily applied into various shapes, and the obtained second layer can be a porous protective layer.

With regard to the method for manufacturing the volatilization suppressing component according to the present disclosure, it is preferable that the liquid layer is formed by brush coating or spray coating. The number of occurrence of the crack in the first layer is reduced.

Advantageous Effects of Disclosure

According to the present disclosure, a volatilization suppressing component having a laminated film in which detachment of a coating layer and propagation of cracks as an oxygen invasion route are not likely to occur, can be provided. Furthermore, according to the present disclosure, a method for manufacturing a volatilization suppressing component with improved productivity can be provided.

BRIEF DESCRIPTION OF THE DRAWINGS

FIG. 3(a) is an outline diagram illustrating the state in which the first layer has penetrated into the anchor, FIG. 3(b) is an explanatory diagram illustrating the region of the first layer that has penetrated into the anchor, while FIG. 3(c) is an explanatory diagram illustrating the region of the anchor.

DETAILED DESCRIPTION OF THE PREFERRED EMBODIMENT

Hereinafter, the present disclosure will be described in detail by disclosing exemplary embodiments; however, the present disclosure is not to be construed to be limited by these descriptions. So long as the effects of the present disclosure are provided, the exemplary embodiments may be subjected to various modifications.

Figure 1:
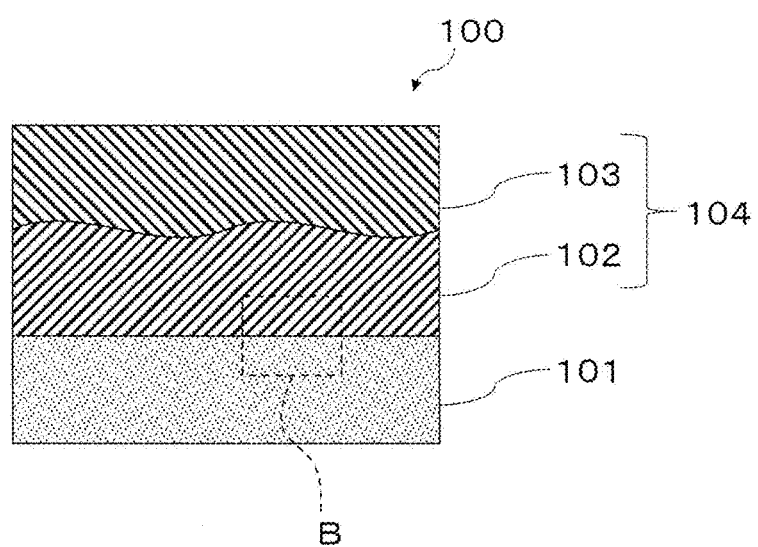
FIG. 1 is a cross-sectional outline diagram illustrating an example of a cross-sectional structure of the volatilization suppressing component according to the present disclosure.

FIG. 1 is a cross-sectional outline diagram illustrating an example of a cross-sectional structure of the volatilization suppressing component according to the present disclosure. The volatilization suppressing component 100 according to the present exemplary embodiment has a metallic base material 101; and a laminated film 104 having at least a first layer 102 formed on a portion or the entirety of a surface of the metallic base material 101, and a second layer 103 formed on the first layer 102, and the first layer 102 is an adhesive layer between the metallic base material 101 and the second layer 103, while the second layer 103 is a protective layer for the first layer 102.

The metallic base material 101 may have a shape of a crucible, a container, a stirring component used in a furnace for glass manufacture, or an incidental tool of a furnace for glass manufacture, and at the time of use, a portion or the entirety of the surface of the metallic base material 101 may be exposed to oxygen and thereby undergo oxidative deterioration and oxidative volatilization.

A material of the metallic base material 101 is preferably platinum, a platinum alloy, iridium, or an iridium alloy. The material of the metallic base material 101 can be selected in accordance with purity and quality of an intended manufactured product. The present exemplary embodiment is not limited to the shape and use application of the metallic base material 101.

In an embodiment in which the material of the metallic base material 101 is a platinum alloy or an iridium alloy, the material may be a dispersion-strengthened alloy in which an oxide or a nitride is dispersed in each metal element. Each metal element is pure platinum having a purity of 99.9% or higher, or pure iridium having a purity of 99.9% or higher. The oxide is, for example, zirconium oxide, hafnium oxide, yttrium oxide, magnesium oxide, titanium oxide, or aluminum oxide. The nitride is, for example, boron nitride, silicon nitride, zirconium nitride, tantalum nitride, niobium nitride, hafnium nitride, or yttrium nitride. Regarding the oxide or nitride, only one kind thereof may be used, or two or more kinds thereof may be used in combination. The dispersion-strengthened alloy is, for example, a dispersion-strengthened alloy having an oxide dispersed in pure platinum having a purity of 99.9% or higher, a dispersion-strengthened alloy having a nitride dispersed in pure platinum having a purity of 99.9% or higher, a dispersion-strengthened alloy having an oxide dispersed in pure iridium having a purity of 99.9% or higher, or a dispersion-strengthened alloy having a nitride dispersed in pure iridium having a purity of 99.9% or higher.

Alternatively, in an embodiment in which the material of the metallic base material 101 is a platinum alloy or an iridium alloy, the material may be a binary or higher alloy, for example, a binary alloy or a ternary alloy, containing platinum as a main component; or a binary or higher alloy, for example, a binary alloy or a ternary alloy, containing iridium as a main component. According to the present specification, containing platinum as a main component implies that a content (% by mass) of platinum among metal components constituting the alloy is the largest, and more preferably, the content of platinum in the alloy is 50% by mass or more. In the present specification, an alloy containing platinum as a main component may be described as "Pt-M ("M" represents a metal other than the element described in front (in this case, Pt))". Furthermore, the same also applies to the case of containing iridium as a main component. Specific preferred examples of the alloy include Pt—Ir, Pt—Rh, Pt—Ru, Pt—Re, Pt—Mo, Pt—W, Pt—Pd, Pt—Au, Pt—Ir—Rh, Pt—Rh—Pd, Ir—Pt, Ir—Rh, Ir—Ru, Ir—Re, Ir—Mo, Ir—W, Ir—Pd, Ir—Zr, Ir—Hf, Ir—Pt—Pd, Ir—Rh—Pd, Ir—Pt—Au, Ir—Rh—Au, and Ir—Re—Zr. Furthermore, the alloy may also be a dispersion-strengthened alloy in which an oxide or a nitride is dispersed in each alloy.

A thickness of the metallic base material 101 is not particularly limited; however, the thickness is preferably 0.1 to 10 mm, and more preferably 0.3 to 5 mm.

Figure 2:
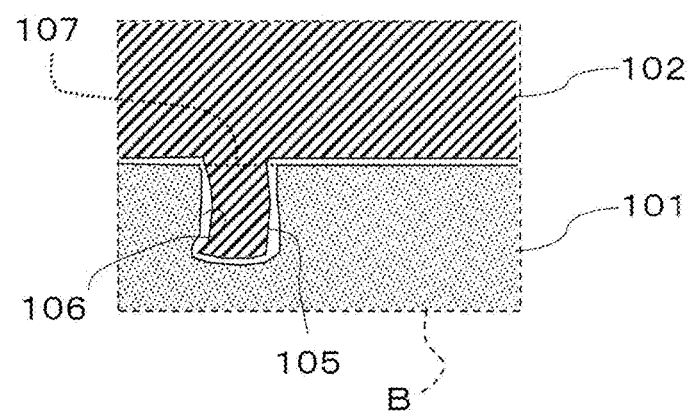
FIG. 2 is a magnified view of an interfacial region B in FIG. 1.

FIG. 2 is a magnified view of an interfacial region B in FIG. 1. In the volatilization suppressing component 100 according to the present exemplary embodiment, the metallic base material 101 has anchors 106 at a vertical cross-section representing the thickness of the base material, and an average cross-sectional area per anchor is preferably 300 $\mu m^2$ or more, more preferably 300 $\mu m^2$ to 1000 $\mu m^2$, and even more preferably 300 $\mu m^2$ to 800 $\mu m^2$. When the thickness is less than 300 $\mu m^2$, there is a possibility that a fixing strength between the first layer 102 and the metallic base material 101 may be decreased. Here, an anchor 106 is a recess formed on the surface of the metallic base material 101. As the metallic base material 101 acquires a rough outer surface due to the anchors 106, and coating particles penetrate into the anchors 106 of the metallic base material 101, the fixing strength between the first layer 102 and the metallic base material 101 is increased. The average cross-sectional area per anchor may be measured by an analysis of a microscope image of the anchors 106.

The first layer 102 is formed on a portion or the entirety of the surface of the metallic base material 101. An embodiment in which the first layer 102 is formed on a portion of the surface of the metallic base material 101 is, for example, an embodiment in which only a portion, where the temperature is likely to become high and oxidative deterioration and oxidative volatilization are concerned, is coated. In a case where the metallic base material 101 is a crucible or a container, it is preferable that the first layer 102 is formed on a portion or the entirety of an outer surface of the crucible or the container. Furthermore, in addition to the outer surface of the crucible or the container, the first layer 102 may also be provided at a portion that comes into contact with outside air on an inner surface of the crucible or the container. The portion that comes into contact with outside air on the inner surface of the crucible or the container is, for example, a portion, which is not in contact with an intended manufactured product or a raw material of the manufactured product, of the inner surface of the crucible or the container, a vicinity of an opening in the inner surface of the crucible or the container.

The first layer 102 may be formed of an oxide containing any one element of zirconium, silicon, aluminum, hafnium, calcium, magnesium, beryllium, thorium, or yttrium as a main component, or a composite oxide of these. According to the present specification, containing zirconium as a main component implies that a content of zirconium (% by mass) among metal components constituting the oxide is largest, and more preferably, the content of zirconium in the oxide is 50% by mass or more. The same also applies to a case where any one element of silicon, aluminum, hafnium, calcium, magnesium, beryllium, thorium, or yttrium is included as a main component. Furthermore, the composite oxide may form a solid solution. Since these oxides have high heat resistance, a contact between the outer surface of the metallic base material 101 and the outside air can be efficiently suppressed, and oxidative deterioration and oxidative volatilization of the metal forming the metallic base material 101 can be further suppressed. A more preferred embodiment of the first layer 102 is an embodiment in which the oxide is zirconia, that is, an embodiment in which the oxide is stabilized zirconia containing 3 to 20% by mass of at least one oxide selected from the group consisting of yttria, magnesia, calcia, and hafnia as a stabilizer.

An average particle size in the first layer 102 is preferably more than 2 $\mu m$ and 20 $\mu m$ or less, and more preferably 3 $\mu m$ or more and 10 $\mu m$ or less. When the average particle size is 2 $\mu m$ or less, there is a possibility that detachment may easily occur due to slipping between particles at a high temperature in the first layer 102. Furthermore, when the average particle size is more than 20 $\mu m$, it is difficult for the first layer to penetrate into the anchors 106, and there is a possibility that adhesiveness between the metallic base material 101 and the first layer 102 may become poor. The average particle size may be measured by a line segment method.

Figure 3:
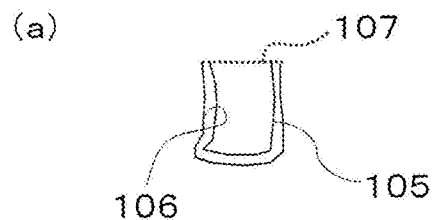
FIG. 3 is an explanatory diagram illustrating an anchor in the interfacial region B and a first layer that has penetrated into the anchor.
Figure 3:
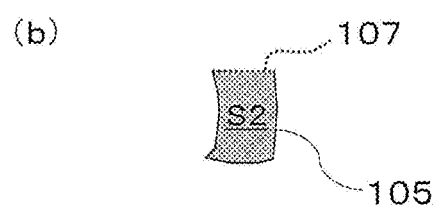
Figure 3:
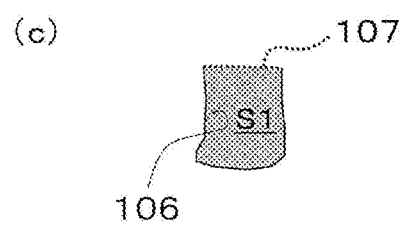

FIG. 3 is an explanatory diagram illustrating an anchor in the interfacial region B and the first layer 102 that has penetrated into the anchor 106. A region S1 of the anchor 106 in a vertical cross-section is an area surrounded by a surface auxiliary line 107 of the metallic base material 101 and the anchor 106, as shown in FIG. 3(c). A region S2 of the first layer 102 that has penetrated into the anchor 106 is an area surrounded by the surface auxiliary line 107 of the metallic base material 101 and a penetration curve part 105 of the first layer 102, as shown in FIG. 3(b). An area proportion (S2/S1) of the region S2 of the first layer 102 that has penetrated into the anchor 106 with respect to the region S1 of the anchor 106 is preferably 85% to 100%, and more preferably 90% to 100%. When the proportion is less than 85%, there is a possibility that the fixing strength between the first layer 102 and the metallic base material 101 may be decreased. As the constituent particles of the first layer 102 penetrate into the anchor 106 and are fixed to accomplish by acting as a hook, the fixing strength between the first layer 102 and the metallic base material 101 is increased.

An average porosity of the first layer 102 is preferably less than 10%, and more preferably less than 5%. A lower average porosity is more preferable. When the average porosity is 10% or more, cracks are likely to be occurred in an area of the surface auxiliary line 107 of the metallic base material 101 within the anchor 106, and there is a possibility that the adhesiveness between the metallic base material 101 and the first layer 102 may become poor. The average porosity may be measured by an analysis of a microscope image of a cross-section of the first layer 102.

An average thickness of the first layer 102 is preferably 50 μm or more and 150 μm or less, and more preferably 50 μm or more and 100 μm or less. When the average thickness is less than 50 μm, there is a possibility that an oxygen barrier property may be insufficient. Furthermore, when the average thickness is more than 150 μm, flexibility may become poor, and there is a possibility that cracks caused by the difference in the thermal expansion between the material of the metallic base material 101 and the material of the first layer 102 are likely to be occurred. The average thickness may be measured by an analysis of a microscope image of a cross-section of the first layer 102.

The first layer 102 is an adhesive layer for covering the metallic base material 101, and as the metallic base material 101 and the first layer 102 adhere to each other, detachment is unlikely to occur so that oxidative deterioration and oxidative volatilization occurring in the metallic base material 101 in which metal portions are exposed due to detachment are prevented.

The second layer 103 is formed to be laminated on the first layer 102 and is preferably formed to be laminated on the entire first layer 102. By being laminated on the entire first layer, the second layer can further protect the first layer 102.

The second layer 103 may be formed of an oxide containing any one element of zirconium, silicon, aluminum, hafnium, calcium, magnesium, beryllium, thorium, or yttrium as a main component, or a composite oxide of these. According to the present specification, containing any one element of zirconium, silicon, aluminum, hafnium, calcium, magnesium, beryllium, thorium, or yttrium as a main component is similar to the case of the first layer. The composite oxide may form a solid solution. Since these oxides have high heat resistance, by the second layer 103 as well as the first layer 102, contact between the outer surface of the metallic base material 101 and the outside air can be efficiently suppressed, and oxidative deterioration and oxidative volatilization of the metal forming the metallic base material 101 can be further suppressed. A more preferred embodiment of the second layer 103 is similar to the more preferred embodiment of the first layer 102.

An average particle size in the second layer 103 is preferably 0.5 μm or more and 2 μm or less, and more preferably 0.5 μm or more and 1.5 μm or less. When the average particle size is more than 2 μm, slipping between particles at a high temperature of the second layer 103 becomes poor, cracks occurred in the first layer 102 are easily propagated to the second layer 103, stress is applied to the first layer 102 so that deformation easily occurs, and there is a possibility that the cracks are likely to be occurred in the first layer 102. The average particle size may be measured by a line segment method.

An average porosity of the second layer 103 is preferably 10% or more and 50% or less, and more preferably 10% or more and 40% or less. When the average porosity is less than 10%, flexibility of the second layer 103 is insufficient, and there is a possibility that the cracks occurred in the first layer 102 may be easily propagated to the second layer 103. Furthermore, when the average porosity is more than 50%, there is a possibility that the oxygen barrier properties may become poor. The average porosity may be measured by an analysis of a microscope image of a cross-section of the second layer 103.

An average thickness of the second layer 103 is preferably 30 μm or more and 65 μm or less, and more preferably 35 μm or more and 55 μm or less. When the average thickness is less than 30 μm, there is a possibility that the oxygen barrier properties may be insufficient. Furthermore, when the average porosity is more than 65 μm, flexibility is insufficient, and there is a possibility that the cracks occurred in the first layer 102 may be easily propagated to the second layer 103. The average thickness may be measured by an analysis of a microscope image of a cross-section of the second layer 103.

Figure 4:
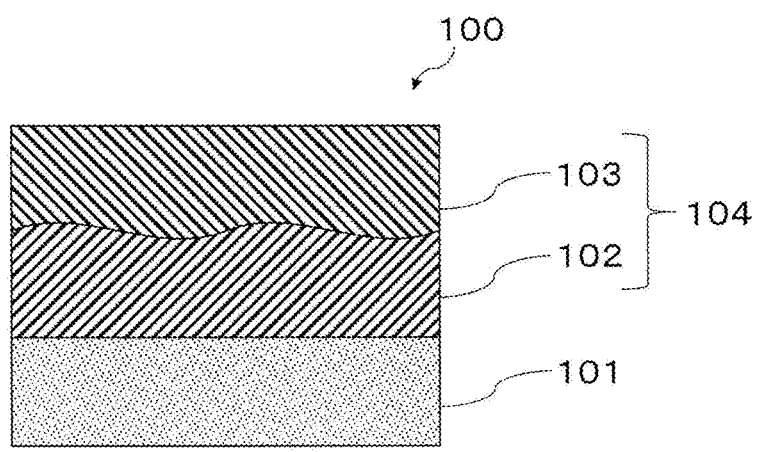
FIG. 4 is a cross-sectional outline diagram illustrating an example of the cross-sectional structure before using the volatilization suppressing component according to the present disclosure.
Figure 5:
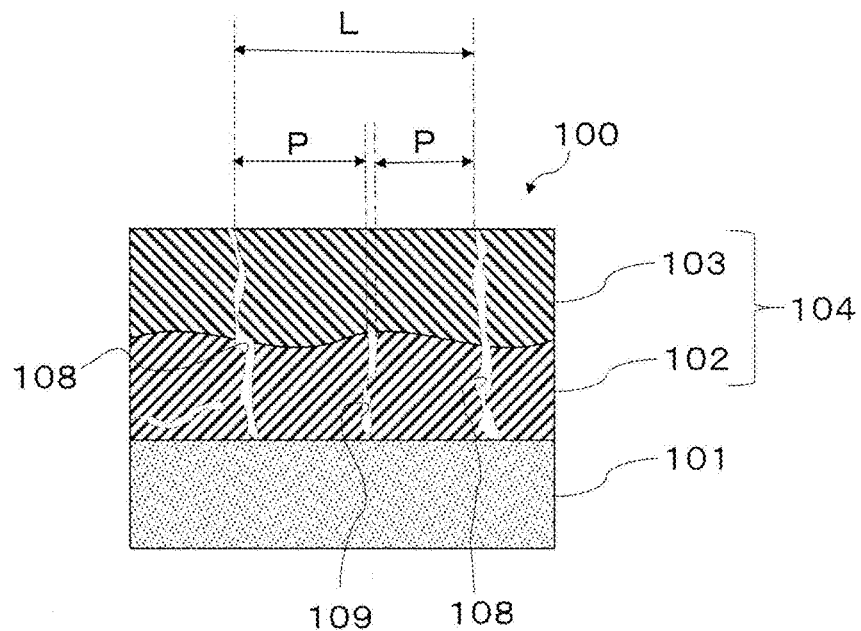
FIG. 5 is a cross-sectional outline diagram illustrating an example of the cross-sectional structure after using the volatilization suppressing component according to the present disclosure.

FIG. 4 is a cross-sectional outline diagram illustrating an example of the cross-sectional structure before using the volatilization suppressing component according to the present disclosure. FIG. 5 is a cross-sectional outline diagram illustrating an example of the cross-sectional structure after using the volatilization suppressing component according to the present disclosure. The second layer 103 is a protective layer that suppresses the propagation of the cracks occurred in the first layer 102, the cracks being in an approximately vertical direction with respect to the metallic base material 101, by means of the flexibility of the second layer 103 itself. As the volatilization suppressing component 100 is used, the volatilization suppressing component 100 expands and contracts. After using it, the cracks in an approximately vertical direction with respect to the metallic base material 101 are occurred in the first layer 102. Among them, some cracks are propagated to the surface of the laminated film 104 as in the case of through-cracks 108; however, even if some other cracks are occurred, the second layer 103 seals the cracks and thereby prevents the cracks from being propagated to the surface of the laminated film 104 as in the case of sealed cracks 109.

The laminated film 104 has at least a first layer 102 and a second layer 103. One or a plurality of coating layers may be provided on the second layer 103 to the extent that the intended effects of the present disclosure are not impaired. The embodiment in which one or a plurality of coating layers are provided is, for example, an embodiment in which a third layer, in which an element serving as a main component is the same as the element serving as a main component in the first layer 102 and the second layer 103, is provided while an average porosity of or an average particle size in the third layer is different from the average porosity of or the average particle size in the first layer 102 and the second layer 103; or an embodiment in which a third layer, in which an element serving as a main component is different from the element serving as the main component in the first layer 102 and the second layer 103, is provided. According to the present specification, the element serving as a main component refers to an element whose content (% by mass) is the largest among the elements of the metal component constituting the oxide in each layer, and more preferably, the element serving as a main component is an element whose content in the oxide is 50% by mass or more.

In the volatilization suppressing component 100 according to the present exemplary embodiment, the first layer 102 is an adhesive layer between the metallic base material 101 and the second layer 103, and the second layer 103 is a protective layer for the first layer 102. In an embodiment in which the protective layer is provided on the metallic base material, and the adhesive layer is further provided on the protective layer to reverse the vertical relation of lamination, detachment at the interface between the metallic base material and the protective layer is likely to occur.

With regard to the volatilization suppressing component 100 according to the present exemplary embodiment, it is preferable that the first layer 102 is denser than the second layer 103. In the laminated film 104, an oxygen invasion route is not likely to be occurred. Here, the term dense means that an average porosity is low. When the average porosity of the first layer 102 is higher than the average porosity of the second layer 103, since a structure in which the second layer 103 in which cracks are more likely to be occurred than the first layer 102 is laminated on the first layer 102 into which oxygen can more easily penetrate than the second layer 103, is obtained, there is a possibility that the oxygen invasion route may be easily occurred in the laminated film 104. When the average porosity of the first layer 102 is the same as the average porosity of the second layer 103, as an interlayer between the first layer 102 and the second layer 103 is continuous, there is a possibility that cracks occurred in the first layer 102 may be easily propagated to the second layer 103.

With regard to the volatilization suppressing component 100 according to the present exemplary embodiment, it is preferable that the first layer 102 is a dense adhesive layer having an average porosity of lower than 10%, and the second layer 103 is a porous protective layer having an average porosity of 10% or higher and 50% or lower. As the constituent particles of the first layer 102 penetrate in a dense state into the anchors 106 of the metallic base material 101, the adhesiveness between the metallic base material 101 and the first layer 102 is further enhanced, the interlayer between the first layer 102 and the second layer 103 is discontinuous, and as the porous second layer 103 has flexibility, it is more difficult for the cracks occurred in the first layer 102 to be propagated to the second layer 103.

With regard to the volatilization suppressing component 100 according to the present exemplary embodiment, it is preferable that the average particle size in the first layer 102 is larger than the average particle size in the second layer 103. The interparticle slipping at a high temperature of the constituent particles of the second layer 103 is improved, and the cracks occurred in the first layer 102 are not easily propagated to the second layer 103. Furthermore, deformation of the first layer 102 is suppressed, and the number of the cracks occurred in the first layer 102 can also be reduced. When the average particle size in the first layer 102 is smaller than the average particle size in the second layer 103, the first layer 102 becomes a layer that is more porous than the second layer 103, a function as the adhesive layer is reduced, and there is a possibility that the first layer 102 may be easily detached. When the average particle size in the first layer 102 is the same as the average particle size in the second layer 103, there is a possibility that deformation of the first layer 102 may not be easily suppressed.

With regard to the volatilization suppressing component 100 according to the present exemplary embodiment, it is preferable that the average particle size in the first layer 102 is more than 2 µm and 20 µm or less, and the average particle size in the second layer 103 is 0.5 µm or more and 2 µm or less. The constituent particles of the first layer 102 can more easily penetrate into the anchors 106, the adhesiveness between the metallic base material 101 and the first layer 102 is further enhanced, the interparticle slipping at a high temperature of the constituent particles of the second layer 103 is improved, it becomes more difficult for the cracks occurred in the first layer 102 to be propagated, deformation of the first layer 102 is further suppressed, and the number of the cracks occurred in the first layer 102 can be further reduced.

With regard to the volatilization suppressing component 100 according to the present exemplary embodiment, it is preferable that the average thickness of the first layer 102 is 50 µm or more and 150 µm or less, and the average thickness of the second layer 103 is 30 µm or more and 65 µm or less. Oxygen barrier properties provided by the laminated film 104 are secured, and the number of cracks occurred due to the lack of flexibility in the laminated film 104 itself is reduced.

A preferred embodiment of the laminated film 104 is an embodiment in which with regard to the combination of oxides contained as main components of the first layer 102 and the second layer 103 (described as (oxide contained as a main component of the first layer 102/oxide contained as a main component of the second layer 103)), the first layer 102 is selected from zirconia, silica, alumina, hafnia, calcia, magnesia, beryllia, thoria, and yttria, and the second layer 103 is selected from zirconia, silica, alumina, hafnia, calcia, magnesia, beryllia, thoria, and yttria, that is, (zirconia/zirconia), (zirconia/silica), (zirconia/alumina), (zirconia/hafnia), (zirconia/calcia), (zirconia/magnesia), (zirconia/beryllia), (zirconia/thoria), (zirconia/yttria), (silica/zirconia), (silica/silica), (silica/alumina), (silica/hafnia), (silica/calcia), (silica/magnesia), (silica/beryllia), (silica/thoria), (silica/yttria), (alumina/zirconia), (alumina/silica), (alumina/alumina), (alumina/hafnia), (alumina/calcia), (alumina/magnesia), (alumina/beryllia), (alumina/thoria), (alumina/yttria), (hafnia/zirconia), (hafnia/silica), (hafnia/alumina), (hafnia/hafnia), (hafnia/calcia), (hafnia/magnesia), (hafnia/beryllia), (hafnia/thoria), (hafnia/yttria), (calcia/zirconia), (calcia/silica), (calcia/alumina), (calcia/hafnia), (calcia/calcia), (calcia/magnesia), (calcia/beryllia), (calcia/thoria), (calcia/yttria), (magnesia/zirconia), (magnesia/silica), (magnesia/alumina), (magnesia/hafnia), (magnesia/calcia), (magnesia/magnesia), (magnesia/beryllia), (magnesia/thoria), (magnesia/yttria), (beryllia/zirconia), (beryllia/silica), (beryllia/alumina), (beryllia/hafnia), (beryllia/calcia), (beryllia/magnesia), (beryllia/beryllia), (beryllia/thoria), (beryllia/yttria), (thoria/zirconia), (thoria/silica), (thoria/alumina), (thoria/hafnia), (thoria/calcia), (thoria/magnesia), (thoria/beryllia), (thoria/thoria), (thoria/yttria), (yttria/zirconia), (yttria/silica), (yttria/alumina), (yttria/hafnia), (yttria/calcia), (yttria/magnesia), (yttria/beryllia), (yttria/thoria), and (yttria/yttria). According to the present specification, the oxide contained as a main component refers to an oxide whose content (% by mass) is the largest among the oxide components constituting the respective layers of the first layer 102 and the second layer 103, and more preferably, the oxide is an oxide whose content is 50% by mass or more among the oxide components constituting the respective layers of the first layer 102 and the second layer 103. Furthermore, an embodiment in which zirconia is, for example, yttria-stabilized zirconia, magnesia-stabilized zirconia, calcia-stabilized zirconia, or hafnia-stabilized zirconia, that is, (yttria-stabilized zirconia/yttria-stabilized zirconia), (magnesia-stabilized zirconia/yttria-stabilized zirconia), (calcia-stabilized zirconia/yttria-stabilized zirconia), (hafnia-stabilized zirconia/yttria-stabilized zirconia), (yttria-stabilized zirconia/magnesia-stabilized zirconia), (magnesia-stabilized zirconia/magnesia-stabilized zirconia), (calcia-stabilized zirconia/magnesia-stabilized zirconia), (hafnia-stabilized zirconia/magnesia-stabilized zirconia), (yttria-stabilized zirconia/calcia-stabilized zirconia), (magnesia-stabilized zirconia/calcia-stabilized zirconia), (calcia-stabilized zirconia/calcia-stabilized zirconia), (hafnia-stabilized zirconia/calcia-stabilized zirconia), (yttria-stabilized zirconia/hafnia-stabilized zirconia), (magnesia-stabilized zirconia/hafnia-stabilized zirconia), (calcia-stabilized zirconia/hafnia-stabilized zirconia), (hafnia-stabilized zirconia/hafnia-stabilized zirconia), (yttria-stabilized zirconia/zirconia), (magnesia-stabilized zirconia/zirconia), (calcia-stabilized zirconia/zirconia), (hafnia-stabilized zirconia/zirconia), (yttria-stabilized zirconia/silica), (magnesia-stabilized zirconia/silica), (calcia-stabilized zirconia/silica), (hafnia-stabilized zirconia/silica), (yttria-stabilized zirconia/alumina), (magnesia-stabilized zirconia/alumina), (calcia-stabilized zirconia/alumina), (hafnia-stabilized zirconia/alumina), (yttria-stabilized zirconia/hafnia), (magnesia-stabilized zirconia/hafnia), (calcia-stabilized zirconia/hafnia), (hafnia-stabilized zirconia/hafnia), (yttria-stabilized zirconia/calcia), (magnesia-stabilized zirconia/calcia), (calcia-stabilized zirconia/calcia), (hafnia-stabilized zirconia/calcia), (yttria-stabilized zirconia/magnesia), (magnesia-stabilized zirconia/magnesia), (calcia-stabilized zirconia/magnesia), (hafnia-stabilized zirconia/magnesia), (yttria-stabilized zirconia/beryllia), (magnesia-stabilized zirconia/beryllia), (calcia-stabilized zirconia/beryllia), (hafnia-stabilized zirconia/beryllia), (yttria-stabilized zirconia/thoria), (magnesia-stabilized zirconia/thoria), (calcia-stabilized zirconia/thoria), (hafnia-stabilized zirconia/thoria), (yttria-stabilized zirconia/yttria), (magnesia-stabilized zirconia/yttria), (calcia-stabilized zirconia/yttria), (hafnia-stabilized zirconia/yttria), (zirconia/yttria-stabilized zirconia), (zirconia/magnesia-stabilized zirconia), (zirconia/calcia-stabilized zirconia), (zirconia/hafnia-stabilized zirconia), (silica/yttria-stabilized zirconia), (silica/magnesia-stabilized zirconia), (silica/calcia-stabilized zirconia), (silica/hafnia-stabilized zirconia), (alumina/yttria-stabilized zirconia), (alumina/magnesia-stabilized zirconia), (alumina/calcia-stabilized zirconia), (alumina/hafnia-stabilized zirconia), (hafnia/yttria-stabilized zirconia), (hafnia/magnesia-stabilized zirconia), (hafnia/calcia-stabilized zirconia), (hafnia/hafnia-stabilized zirconia), (calcia/yttria-stabilized zirconia), (calcia/magnesia-stabilized zirconia), (calcia/calcia-stabilized zirconia), (calcia/hafnia-stabilized zirconia), (magnesia/yttria-stabilized zirconia), (magnesia/magnesia-stabilized zirconia), (magnesia/calcia-stabilized zirconia), (magnesia/hafnia-stabilized zirconia), (beryllia/yttria-stabilized zirconia), (beryllia/magnesia-stabilized zirconia), (beryllia/calcia-stabilized zirconia), (beryllia/hafnia-stabilized zirconia), (thoria/yttria-stabilized zirconia), (thoria/magnesia-stabilized zirconia), (thoria/calcia-stabilized zirconia), (thoria/hafnia-stabilized zirconia), (yttria/yttria-stabilized zirconia), (yttria/magnesia-stabilized zirconia), (yttria/calcia-stabilized zirconia), and (yttria/hafnia-stabilized zirconia) are also included in the preferred embodiment of the laminated film 104. Yttria-stabilized zirconia refers to zirconia containing 3 to 20% by mass of yttrium oxide as a stabilizer with respect to zirconia, magnesia-stabilized zirconia refers to zirconia containing 3 to 20% by mass of magnesium oxide as a stabilizer with respect to zirconia, calcia-stabilized zirconia refers to zirconia containing 3 to 20% by mass of calcium oxide as a stabilizer with respect to zirconia, and hafnia-stabilized zirconia refers to zirconia containing 3 to 20% by mass of hafnium oxide as a stabilizer with respect to zirconia.

With the volatilization suppressing component 100 according to the present exemplary embodiment, it is preferable that the first layer 102 and the second layer 103 contain the same oxide as a main component. Coefficients of thermal expansion of the first layer 102 and the second layer 103 become an approximation. A more preferred embodiment of the same oxide contained as a main component is an embodiment in which with regard to the combination of oxides contained as main components of the first layer 102 and the second layer 103 (described as (oxide contained as a main component of the first layer 102/oxide contained as a main component of the second layer 103)), the same oxide has been selected from zirconia, silica, alumina, hafnia, calcia, magnesia, beryllia, thoria, and yttria for the first layer 102 and the second layer 103, that is, (yttria-stabilized zirconia/yttria-stabilized zirconia), (magnesia-stabilized zirconia/yttria-stabilized zirconia), (calcia-stabilized zirconia/yttria-stabilized zirconia), (hafnia-stabilized zirconia/yttria-stabilized zirconia), (yttria-stabilized zirconia/magnesia-stabilized zirconia), (magnesia-stabilized zirconia/magnesia-stabilized zirconia), (calcia-stabilized zirconia/magnesia-stabilized zirconia), (hafnia-stabilized zirconia/magnesia-stabilized zirconia), (yttria-stabilized zirconia/calcia-stabilized zirconia), (magnesia-stabilized zirconia/calcia-stabilized zirconia), (calcia-stabilized zirconia/calcia-stabilized zirconia), (hafnia-stabilized zirconia/calcia-stabilized zirconia), (yttria-stabilized zirconia/hafnia-stabilized zirconia), (magnesia-stabilized zirconia/hafnia-stabilized zirconia), (calcia-stabilized zirconia/hafnia-stabilized zirconia), (hafnia-stabilized zirconia/hafnia-stabilized zirconia), (zirconia/zirconia), (silica/silica), (alumina/alumina), (hafnia/hafnia), (calcia/calcia), (magnesia/magnesia), (beryllia/beryllia), (thoria/thoria), and (yttria/yttria).

The laminated film 104 includes a two-layered embodiment of the first layer 102 and the second layer 103, or a three-layered or higher-layered embodiment in which one or a plurality of coating layers is provided on the second layer 103; and, on the whole, it is preferable that the laminated film is an oxide containing any one element of zirconium, silicon, aluminum, hafnium, calcium, magnesium, beryllium, thorium, or yttrium as a main component, or a composite oxide of these. According to the present specification, containing zirconium as a main component implies that the content of zirconium (% by mass) among the metal components constituting the oxide is largest, and more preferably, the content of zirconium in the oxide is 50% by mass or more. The same also applies to a case where any one element of silicon, aluminum, hafnium, calcium, magnesium, beryllium, thorium, or yttrium is included as a main component. The composite oxide may form a solid solution. Since these oxides have high heat resistance, oxidative deterioration and oxidative volatilization of the metal forming the metallic base material 101 can be further suppressed.

A method for manufacturing the volatilization suppressing component 100 according to the present exemplary embodiment is a method for manufacturing the volatilization suppressing component 100 according to the present exemplary embodiment, the method having a step of forming the first layer 102 on the surface of the metallic base material 101 by a thermal spraying method; and a step of forming the second layer 103 by, at least once, a performing the process of forming a liquid layer on the surface of the first layer 102 and of drying and solidifying the liquid layer.

(First Layer Forming Step)

In the thermal spraying, since the first layer 102 is formed by causing the constituent particles that are molten or in a state close to being molten to collide with the metallic base material 101, the proportion of the area occupied by the constituent particles of the first layer 102 with respect to the anchors 106 on the surface of the metallic base material 101 is increased, and the first layer 102 thus formed becomes a dense layer having a porosity of 5% or less.

The thermal spraying method may be flame thermal spraying, plasma thermal spraying, arc thermal spraying, or cold spraying, and the thermal spraying method is preferably plasma thermal spraying. In these thermal spraying methods, since a temperature that sufficiently exceeds the melting point of the thermal spray material to be used is obtained, thermal spraying can be carried out efficiently.

(Second Layer Forming Step)

The method for manufacturing the volatilization suppressing component 100 according to the present exemplary embodiment has a step of forming the second layer 103 by performing, at least once, a process of forming a liquid layer on the surface of the first layer 102 and of drying the solidifying liquid layer. Furthermore, the liquid layer includes an embodiment in which the constituent component of the second layer 103 is dispersed in a dispersing medium, and an embodiment in which the constituent component of the second layer 103 is dissolved in a solvent. For example, the step of forming the second layer 103 includes: (i) an embodiment in which a process of forming a liquid layer on the surface of the first layer 102 and drying the liquid layer to solidify is carried out once to form the second layer 103; (ii) an embodiment in which a process of forming a liquid layer on the surface of the first layer 102 and drying the liquid layer to solidify is carried out twice or more to form the second layer 103; (iii) a colloidal solution layer is formed on the surface of the first layer 102, the colloidal solution layer is dried and solidified to form a coated layer, a solution layer is formed on the surface of the coated layer, and drying and solidifying the solution layer to form the second layer 103; and (iv) an embodiment of repeating the steps of (iii) twice or more. According to the embodiment of (iii), the second layer is a layer in which the coated layer and a dried and solidified product of the solution layer formed on the surface of the coated layer are integrated, and it is preferable that a boundary between the coated layer and the dried and solidified product of the solution layer is not observed.

With regard to the method for manufacturing the volatilization suppressing component 100 according to the present exemplary embodiment, it is preferable that, in the step of forming the second layer 103, a colloidal solution layer is formed at least once as the liquid layer. The manufacturing cost becomes highly inexpensive, the liquid layer can be easily applied onto various shapes, and the obtained second layer 103 can be a porous protective layer.

Regarding the colloidal solution layer, it is more preferable that: (1) the liquid layer is a colloidal solution layer containing colloidal particles of an oxide serving as the main component of the second layer 103; (2) the liquid layer is a colloidal solution layer containing colloidal particles of a simple substance of an element that binds to oxygen in the oxide serving as the main component of the second layer 103, or colloidal particles of an alloy including an element that binds to oxygen in the oxide serving as the main component of the second layer 103; or (3) the liquid layer is a colloidal solution layer containing at least one kind of colloidal particles selected from a hydroxide, an alkoxide compound, a carbonic acid compound, a chloride, an oxychloride compound, and an oxynitric acid compound, all of these compounds including an element that binds to oxygen in the oxide serving as the main component of the second layer 103. The manufacturing cost becomes highly inexpensive, the liquid layer can be easily applied onto various shapes, the second layer 103 which is a porous protective layer is formed more efficiently, and cracks serving as the oxygen invasion route can be suppressed. According to the present specification, the main component of the second layer 103 refers to a component whose content (% by mass) is the largest among the components constituting the second layer 103, and more preferably, the main component is a component whose content in the second layer 103 is 50% by mass or more.

The embodiment in which (1) the liquid layer is the colloidal solution layer containing colloidal particles of the oxide serving as the main component of the second layer 103 is, for example, an embodiment in which particles of oxides of one kind or two or more kinds of elements among zirconium, silicon, aluminum, hafnium, calcium, magnesium, beryllium, thorium, and yttrium are dispersed in a dispersing medium. The particles in the colloidal solution may be composed of one kind or two or more kinds. The dispersing medium is, for example, water. A specific preferred example of the liquid layer is a colloidal solution layer of an oxide of zirconium.

The embodiment in which (2) the liquid layer is the colloidal solution layer containing colloidal particles of the simple substance of the element that binds to oxygen in the oxide serving as the main component of the second layer 103, or colloidal particles of an alloy including the element that binds to oxygen in the oxide serving as the main component of the second layer 103 is, for example, an embodiment in which particles of the simple substance composed of one element of zirconium, silicon, aluminum, hafnium, calcium, magnesium, beryllium, thorium, and yttrium are dispersed in a dispersing medium, or an embodiment in which particles of an alloy composed of two or more elements of zirconium, silicon, aluminum, hafnium, calcium, magnesium, beryllium, thorium, and yttrium are dispersed in a dispersing medium. The particles in the colloidal solution may be composed of one kind or two or more kinds. The dispersing medium is, for example, water. A specific preferred example of the liquid layer is a colloidal solution layer of metallic zirconium.

The embodiment in which (3) the liquid layer is the colloidal solution layer containing at least one kind of colloidal particles selected from a hydroxide, a carbonic acid compound, a chloride, an oxychloride compound, and an oxynitric acid compound, all of these compounds including the element that binds to oxygen in the oxide serving as the main component of the second layer 103 is, for example, an embodiment in which particles of a hydroxide of one kind or two or more kinds of elements of zirconium, silicon, aluminum, hafnium, calcium, magnesium, beryllium, thorium, and yttrium (hereinafter, the element or the elements also referred to as constituent component Z) are dispersed in a dispersing medium; an embodiment in which particles of an alkoxide compound of the constituent component Z are dispersed in a dispersing medium; an embodiment in which particles of a carbonic acid compound of the constituent component Z are dispersed in a dispersing medium; an embodiment in which particles of a chloride of the constituent component Z are dispersed in a dispersing medium; an embodiment in which particles of an oxychloride compound of the constituent component Z are dispersed in a dispersing medium; or an embodiment in which particles of an oxynitric acid compound of the constituent component Z are dispersed in a dispersing medium. The particles in the colloidal solution may be composed of one kind or two or more kinds. The dispersing medium is, for example, water. A specific preferred example of the liquid layer is a colloidal solution layer of zirconium hydroxide.

Regarding the solution layer, the embodiment in which the liquid layer is a solution layer containing at least one kind selected from a hydroxide, a carbonic acid compound, a chloride, an oxychloride compound, and an oxynitric acid compound, all of these compounds including an element that binds to oxygen in the oxide serving as the main component of the second layer 103 is, for example, an embodiment in which a hydroxide of one kind or two or more kinds of elements among zirconium, silicon, aluminum, hafnium, calcium, magnesium, beryllium, thorium, and yttrium (hereinafter, the element or the elements also referred to as constituent component Z) are dissolved in a solvent; an embodiment in which an alkoxide compound of the constituent component Z is dissolved in a solvent; an embodiment in which a carbonic acid compound of the constituent component Z is dissolved in a solvent; a chloride of the constituent component Z is dissolved in a solvent; an embodiment in which an oxychloride compound of the constituent component Z is dissolved in a solvent; or an embodiment in which an oxynitric acid compound of the constituent component Z is dissolved in a solvent. Examples of the dispersing medium include isopropanol, ethanol, and n-butanol. A specific preferred example of the solution layer is a solution layer of a metal alkoxide compound containing silicon alkoxide and zirconium alkoxide.

The liquid layer may contain various additive materials such as a binder so long as the effects of the present disclosure are not impaired. A good-quality laminated film 104 in which the first layer 102 and the second layer 103 adhere to each other and detachment or cracking does not occur can be constructed.

The embodiment of forming a liquid layer is not particularly limited, and includes, for example, brush coating, spray coating, and roller coating. Regarding the embodiment of forming a liquid layer, it is preferable that the liquid layer is formed by brush coating or spray coating. The number of cracks occurred in the first layer is reduced.

With regard to the process of drying and solidifying, the calcination temperature of the liquid layer varies depending on the component of the liquid layer and is not particularly limited; and, for example, when the component of the liquid layer is a zirconium-based component, the calcination temperature is preferably 100 to 200° C., and more preferably 100 to 180° C. By drying and solidifying the liquid layer, the second layer 103 is fixed to the surface of the first layer 102. At this time, since the second layer 103 is sufficiently hard, conventional handling is possible. Subsequently, the second layer may be further subjected to empty heating at a temperature near the use temperature of the volatilization suppressing component. Regarding a timing for the empty heating, the empty heating may be carried out before the actual use of the first time or may be carried out at the time of actual use of the first time.

EXAMPLES

Hereinafter, the present disclosure will be described in more detail by way of Examples; however, the present disclosure is not construed to be limited to the Examples.

<Average Cross-Sectional Area Per Anchor>

Among cross-sections of a volatilization suppressing component, images of a cross-section of a boundary plane between a metallic base material and a first layer were captured using a scanning electron microscope (SEM) (product No. JSM-6010 PLUS/LA, manufactured by JEOL, Ltd.) at a magnification ratio of 2000 times, and five sheets of the images were selected out. Three sites, which were anchors having the first to third largest areas among the anchors in each image, that is, 15 sites in total were selected and designated as measurement regions. Cross-sectional areas S1 of the anchors shown in FIG. 3 were measured using a particle measurement region measuring mode of an image dimension measurement and particle measurement software (product name Quick Grain, manufactured by INOTECH Corp.), and an average value was derived.

<Proportion of Area Occupied by First Layer that has Penetrated into Anchors with Respect to Anchors>

Among cross-sections of a volatilization suppressing component, images of a cross-section of a boundary plane between a metallic base material and a first layer were captured using the SEM at a magnification ratio of 2000 times, and five sheets of the images were selected out. Three sites, which were anchors having the first to third largest areas among the ones in each image, that is, 15 sites in total were selected and designated as measurement regions. A proportion of the area occupied by the first layer that had penetrated into the anchors with respect to the anchors (S2/S1) as shown in FIG. 3 was measured using a particle measurement region measuring mode of the image dimension measurement and particle measurement software.

<Average Particle Size in Each Layer>

Five sheets of images of cross-sections of a volatilization suppressing component captured using the SEM at a magnification ratio of 2000 times were selected out. In each of the layers in each image, five line segments were randomly drawn, and an average particle size in each layer was calculated according to a line segment method.

<Average Porosity of Each Layer>

Five sheets of images of cross-sections of a volatilization suppressing component captured using the SEM at a magnification ratio of 2000 times were selected out. For each of the images, vacancy portions were selected from a contrast, and a porosity was measured by dividing the area of the vacancy portions by the total area of the measurement region. For the measurement, a particle measurement region measuring mode of an image dimension measurement and particle measurement software was used, and an average porosity of each of the layers was measured.

<Average Thickness of Each Layer>

Five sheets of images of cross-sections of a volatilization suppressing component captured using the SEM at a magnification ratio of 200 times were selected out. Five sites were selected and appointed as measurement sites in each of the images, a thickness of each layer was measured, an average value of all the measurement sites was derived, and an average thickness for each of the layers was calculated by dividing the average value by the magnification ratio.

<Average Spacing Between Cracks>

Figure 6:
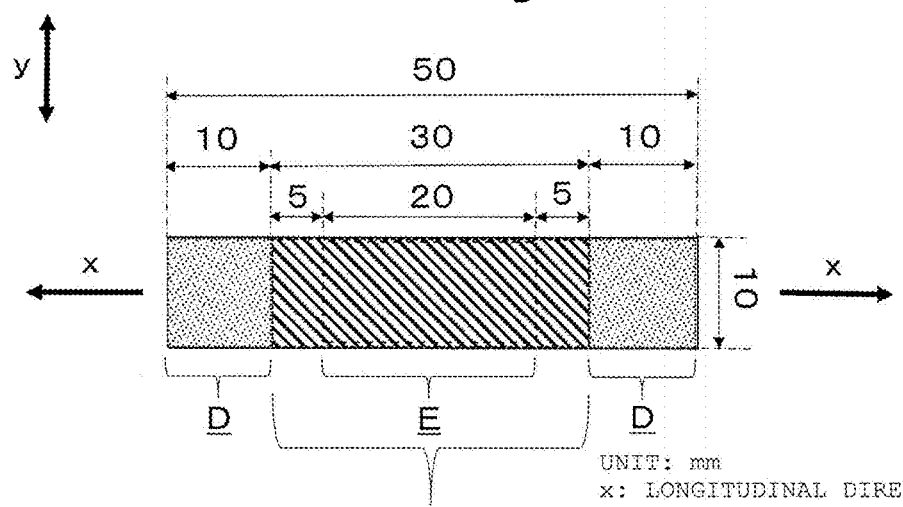
FIG. 6 is a top view outline diagram illustrating various regions in a volatilization suppressing component according to the present Examples.

A spacing between cracks (including through cracks 108 and sealed cracks 109 in FIG. 5) occurred in a first layer in an approximately vertical direction with respect to metallic base material corresponds to P in FIG. 5. A spacing between cracks penetrating through to a laminated film surface (in FIG. 5, refers to through crack 108) among the cracks in the approximately vertical direction with respect to the metallic base material corresponds to L in FIG. 5. An average value of all P's in a measurement region is designated as average spacing $P_{ave}$ between the cracks in the approximately vertical direction with respect to the metallic base material, and an average value of all L's in the measurement region is designated as spacing $L_{ave}$ between the cracks penetrating to the laminated film surface (through crack 108) among the cracks in the approximately vertical direction with respect to the metallic base material. Five sheets of images of cross-sections of a volatilization suppressing component captured using the SEM at a magnification ratio of 200 times were selected out. The images were connected to obtain a width of 1260 to 3200 μm and captured, lengths of spacings between cracks corresponding to P and L in FIG. 5 within the region were measured, and the average values were derived to calculate $P_{ave}$ and $L_{ave}$. It can be said that as $P_{ave}$ is larger, there are fewer cracks in an approximately vertical direction with respect to the metallic base material (through crack 108 or sealed crack 109). It can be said that as $L_{ave}$ is larger, there are fewer cracks penetrating through to the laminated film surface (through crack 108) among the cracks in the approximately vertical direction with respect to the metallic base material. Since it is considered that there is no anisotropy before pulling of the volatilization suppressing component, a direction of observation before pulling of the volatilization suppressing component was set to one direction (a y-direction as shown in FIG. 6).

[Metallic Base Material Made of Platinum]

Example 1

(Metallic Base Material)

A metallic base material made of platinum (manufactured by Furuya Metal Co., Ltd.), which was a short strip that measured 50 mm in length×10 mm in width×1.3 mm in thickness, was prepared.

(Thermal Spray Material)

As a thermal spray material, yttria-stabilized zirconia (containing 2 to 8% by mass of yttrium oxide, particle size 10 to 75 μm) was used.

(First Colloidal Solution and Second Solution)

A dispersion liquid of a zirconium compound having water as a dispersing medium and containing 70 to 80% by mass of a zirconium compound and 1 to 10% by mass of an alkali metal silicate (RUSTAFF 6110, manufactured by ACCESS Co., Ltd.) was used as a first colloidal solution. Furthermore, a solution of a metal alkoxide compound including isopropanol as a main component of the solvent and containing silicon alkoxide and zirconium alkoxide (RUSTAFF 6120, manufactured by ACCESS Co., Ltd.) was used as a second solution.

(Production of Volatilization Suppressing Component)

The thermal spray material was sprayed on the entirety of a surface of the metallic base material using a plasma thermal spraying apparatus, and thereby a first layer was formed. The metallic base material having the first layer formed thereon was cooled to room temperature, subsequently the first colloidal solution was manually applied on a region C having a size of 30 mm in length×10 mm in width in the first layer as shown in FIG. 6 in the longitudinal direction using a brush, and thereby a first liquid layer was formed. The first liquid layer was naturally dried and then was maintained at 150° C. for 20 minutes using an electric furnace. Thereby, the first liquid layer was dried and solidified, and thus a coated layer was formed. After drying and solidifying, the second solution was manually applied on the entirety of a surface of the coated layer in the longitudinal direction using a brush, and thus a second liquid layer was formed. After the second liquid layer was naturally dried, the second liquid layer was maintained at 100° C. for 20 minutes using the electric furnace. In this way, the second liquid layer was dried and solidified to form a second layer on the region C in the first layer, and a volatilization suppressing component was produced. The second layer includes the coated layer and a dried and solidified product of the second liquid layer formed by applying the second solution. That is, the second layer contains components of the first colloidal solution other than the dispersing medium and components of the second solution other than the solvent. Subsequently, in order to perform evaluation, the volatilization suppressing component was subjected to empty heating for 60 minutes at 1300° C. Regarding the electric furnace, a SiC furnace (product No. MSFT-1520, manufactured by Yamada Denki Co., Ltd.) was used. When the volatilization suppressing component was subjected to empty heating at 1300° C., the temperature was raised to 1300° C. in 5 hours, the component was maintained for one hour at 1300° C., subsequently the temperature was lowered to room temperature in 5 hours, and then the volatilization suppressing component was taken out.

(Observation of Surface of Volatilization Suppressing Component)

Figure 7:
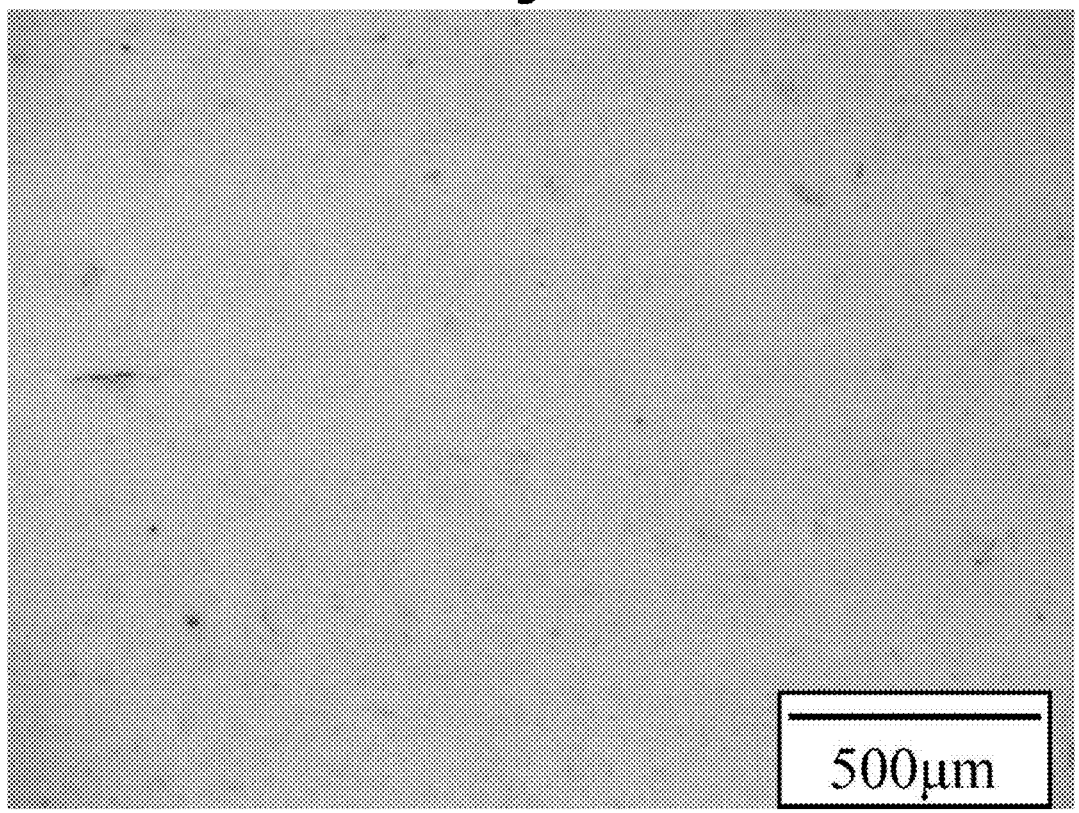
FIG. 7 is a microscope image of a surface before a tensile test of a volatilization suppressing component obtained in Example 1.

An image of a surface of the volatilization suppressing component was captured using a microscope (product No. VHX-1000, manufactured by Keyence Corp.). The image of the surface of the volatilization suppressing component is presented in FIG. 7. Detachment at the surface of the volatilization suppressing component did not occur.

(Observation of Cross-Section of Volatilization Suppressing Component)

Figure 8:
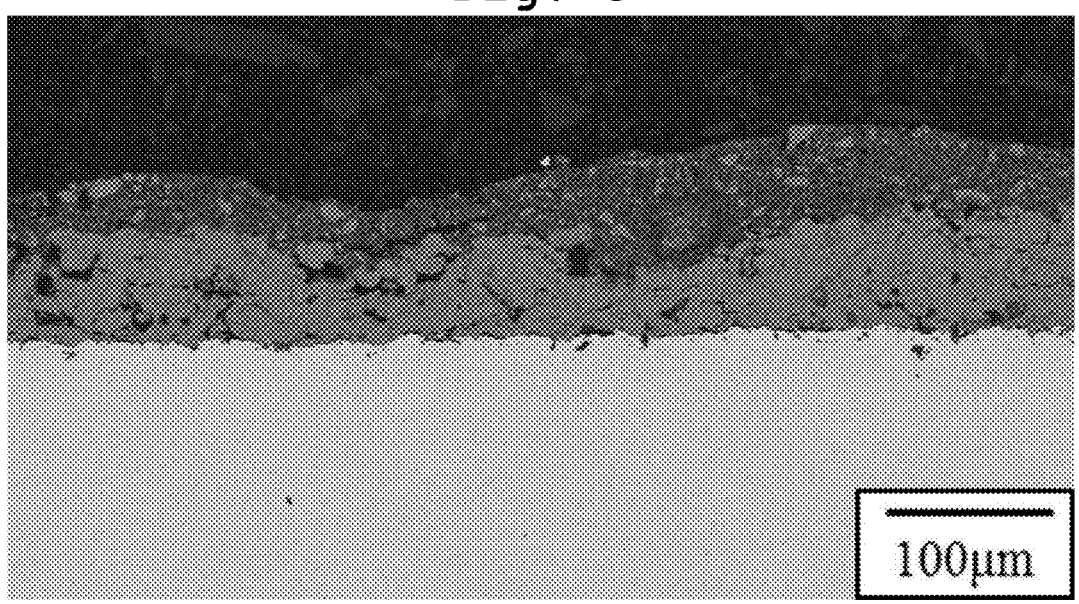
FIG. 8 is a scanning electron microscope (SEM) image of a cross-section before the tensile test of the volatilization suppressing component obtained in Example 1, the image being obtained by making an observation from a y-direction as in FIG. 6.

An image of a cross-section of the volatilization suppressing component was captured using the SEM. The image of the cross-section of the volatilization suppressing component observed in the y-direction as in FIG. 6 is presented in FIG. 8. With regard to the volatilization suppressing component, in the cross-section observed in the y-direction, there was no detachment at an interface between the metallic base material and the first layer, and there was no crack in an approximately vertical direction with respect to the metallic base material. In the cross-section of the volatilization suppressing component shown in FIG. 8, images of a cross-section of a boundary plane between the metallic base material and the first layer were captured using the SEM at a magnification ratio of 2000 times, an analysis was performed using five sheets of the images, and as a result, an average cross-sectional area per anchor was 319.37 μm², while a proportion of an area occupied by the first layer that had penetrated into anchors with respect to the anchors (S2/S1) was 91%. The first layer had an average porosity of 3.92%, an average particle size of 4.92 μm, and an average thickness of 100 μm. The second layer had an average porosity of 24.56%, an average particle size of 1.24 μm, and an average thickness of 41 μm.

(Tensile Test 1)

At room temperature, regions D each having a size of 10 mm in length×10 mm in width at both ends of a volatilization suppressing component as shown in FIG. 6 were set on chucks of a universal testing machine (product No. 5581, manufactured by Instron Corp.) and fixed, and a tensile test was carried out by adjusting the tensile rate at 0.2 mm/min and adjusting the gauge length to 20 mm as shown by region E. When the tensile direction was set to an x-direction as shown in FIG. 6, and the elongation between gauge marks was adjusted to 1.4%, which corresponds to the coefficient of thermal expansion of platinum obtainable in case of increasing the temperature of platinum from room temperature to 1300° C., there was no detachment at the surface under visual inspection.

(Tensile Test 2)

Figure 9:
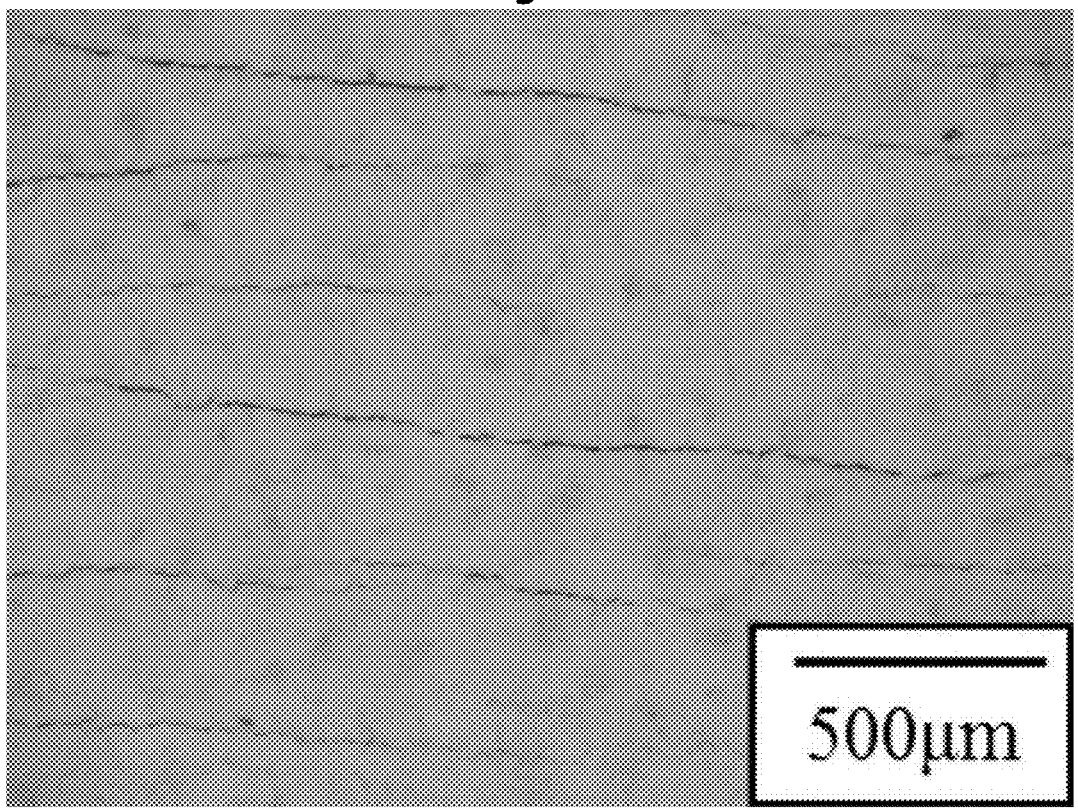
FIG. 9 is a microscope image of the surface after the tensile test of the volatilization suppressing component obtained in Example 1.
Figure 10:
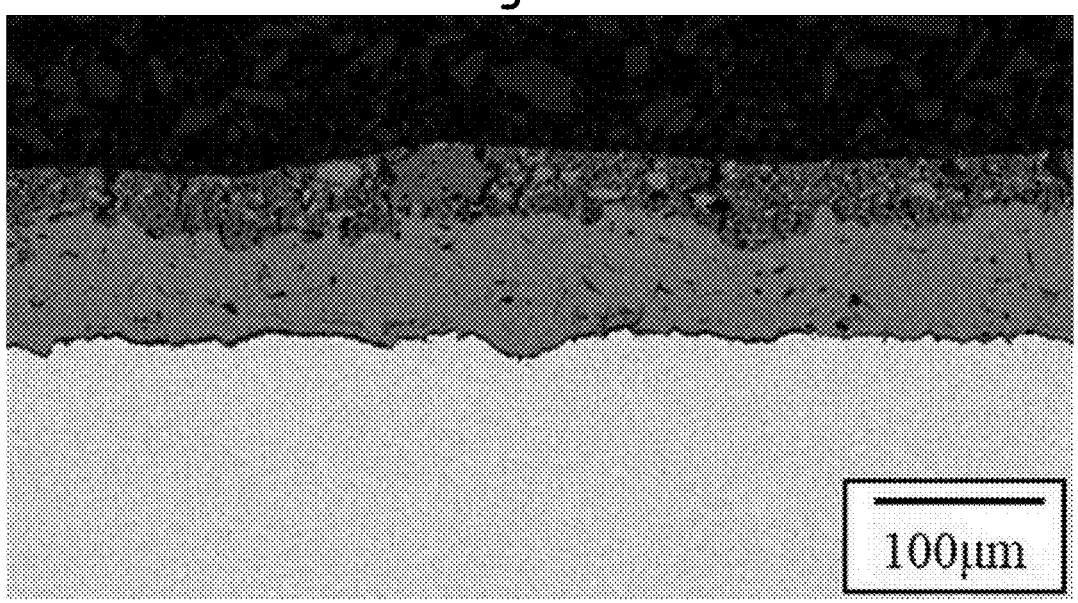
FIG. 10 is a SEM image of a cross-section after the tensile test of the volatilization suppressing component obtained in Example 1, the image being obtained by making an observation from an x-direction as in FIG. 6.
Figure 11:
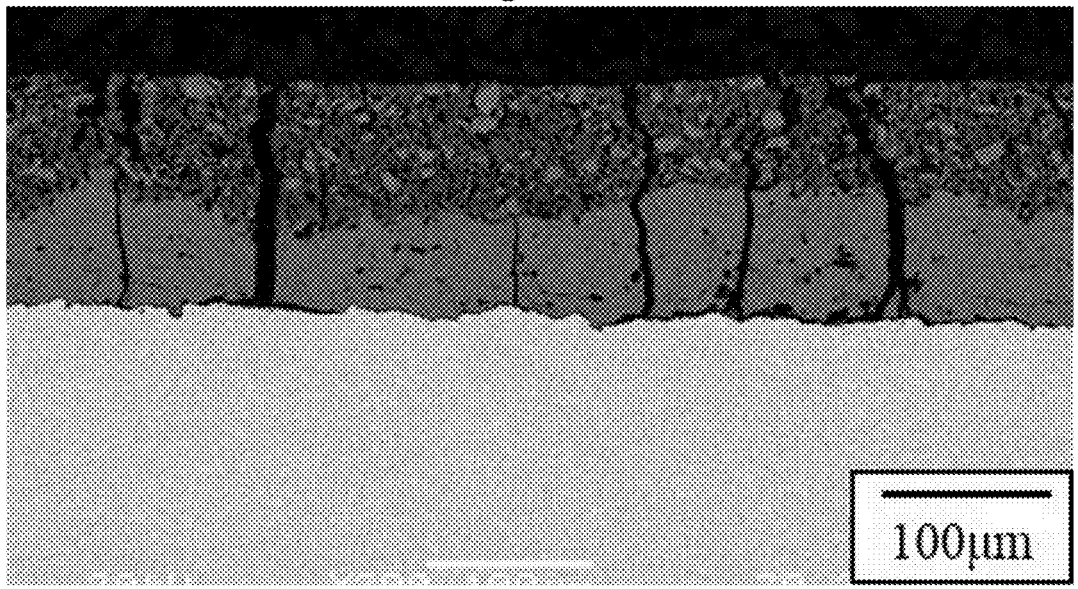
FIG. 11 is a SEM image of a cross-section after the tensile test of the volatilization suppressing component obtained in Example 1, the image being obtained by making an observation from the y-direction as in FIG. 6.

A test was carried out by setting the elongation between gauge marks to 5.1%, which is more severe, and using the volatilization suppressing component of the tensile test 1. The x-direction and the y-direction were as shown in FIG. 6. After the tensile test, there was no detachment at the surface under visual inspection. An image of the surface of the volatilization suppressing component was captured using the microscope. The image of the surface of the volatilization suppressing component is presented in FIG. 9. Detachment at the surface of the volatilization suppressing component did not occur. Images of a cross-section of the volatilization suppressing component were captured using the SEM. An image of a cross-section of the volatilization suppressing component observed in the x-direction as in FIG. 6 is presented in FIG. 10, and an image of the cross-section observed in the y-direction is presented in FIG. 11. In the cross-section of the volatilization suppressing component observed in the x-direction, there was no detachment at the interface between the metallic base material and the first layer, and also, there were no cracks in an approximately vertical direction with respect to the metallic base material. In the cross-section of the volatilization suppressing component observed in the y-direction, there was no detachment at an interface between the metallic base material and the first layer; however, there were cracks in an approximately vertical direction with respect to the metallic base material. When the cross-section was observed in the y-direction, an average spacing $P_{ave}$ between cracks was 129 μm, and an average spacing $L_{ave}$ between cracks was 157 μm. Since there was no detachment at the interface between the metallic base material and the first layer, the first layer had satisfactory adhesiveness.

Example 2

(Metallic Base Material)

A metallic base material was prepared in the same manner as in Example 1.

(Thermal Spray Material)

A thermal spray material similar to that of Example 1 was used.

(First Colloidal Solution and Second Solution)

A first colloidal solution and a second solution similar to those of Example 1 were used.

(Production of Volatilization Suppressing Component)

A first layer was formed in the same manner as in Example 1. The metallic base material having the first layer formed thereon was cooled to room temperature, and then the first colloidal solution was applied on a region C having a size of 30 mm in length×10 mm in width in the first layer as shown in FIG. 6 using a spray coating machine (product No. W-100, manufactured by ANEST IWATA Corp.) to form a first liquid layer. The first liquid layer was dried by natural drying and then was maintained for 20 minutes at 150° C. using an electric furnace to dry and solidify, and thereby a coated layer was formed. After drying and solidifying, the second solution was manually applied on the entirety of a surface of the coated layer using a brush to form a second liquid layer. The second liquid layer was naturally dried and then was maintained for 20 minutes at 100° C. using the electric furnace to dry and solidify, thereby a second layer was formed on the region C in the first layer, and a volatilization suppressing component was produced. The second layer includes the coated layer and a dried and solidified product of the second liquid layer formed by applying the second solution. That is, the second layer contains components of the first colloidal solution other than the dispersing medium and components of the second solution other than the solvent. Thereafter, the volatilization suppressing component was subjected to empty heating for 60 minutes at 1300° C. for an evaluation. Regarding the electric furnace, a SiC furnace (product No. MSFT-1520, manufactured by Yamada Denki Co., Ltd.) was used. When the volatilization suppressing component was subjected to empty heating at 1300° C., the temperature was raised to 1300° C. in 5 hours, the component was maintained for one hour at 1300° C., subsequently the temperature was lowered to room temperature in 5 hours, and then the volatilization suppressing component was taken out.

(Observation of Surface of Volatilization Suppressing Component)

Figure 12:
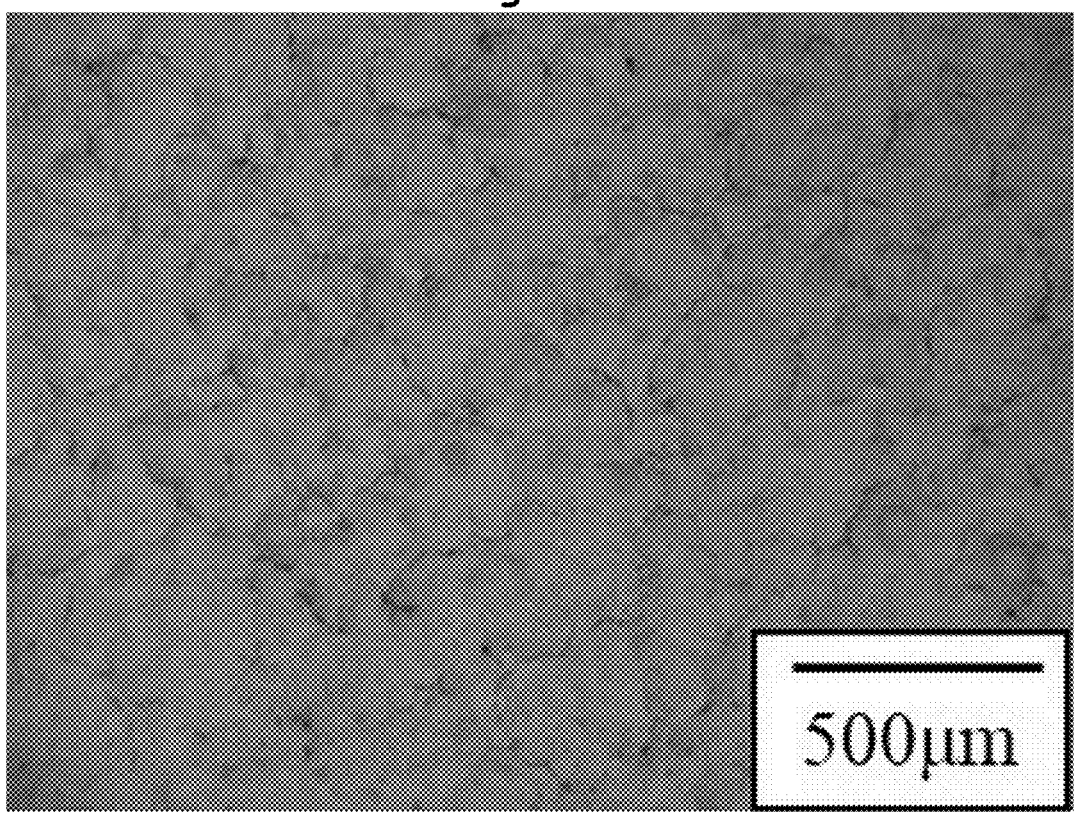
FIG. 12 is a microscope image of a surface before a tensile test of a volatilization suppressing component obtained in Example 2.

An image of a surface of the volatilization suppressing component was captured using the microscope. The image of the surface of the volatilization suppressing component is presented in FIG. 12. Detachment at the surface of the volatilization suppressing component did not occur.

(Observation of Cross-Section of Volatilization Suppressing Component)

Figure 13:
FIG. 13 is a SEM image of a cross-section before the tensile test of the volatilization suppressing component obtained in Example 2, the image being obtained by making an observation from the y-direction as in FIG. 6.

An image of a cross-section of the volatilization suppressing component was captured using the SEM. The image of the cross-section of the volatilization suppressing component observed in the y-direction as in FIG. 6 is presented in FIG. 13. With regard to the volatilization suppressing component, in the cross-section observed in the y-direction, there was no detachment at an interface between the metallic base material and the first layer, and there was no crack in an approximately vertical direction with respect to the metallic base material. In the cross-section of the volatilization suppressing component shown in FIG. 13, images of a cross-section of the boundary plane between the metallic base material and the first layer were captured using the SEM at a magnification ratio of 2000 times, an analysis was performed using five sheets of the images, and as a result, anchors and the first layer were formed in the same manner as in Example 1. The second layer had an average porosity of 17.69%, an average particle size of 1.13 μm, and an average thickness of 62 μm.

(Tensile Test 1)

A tensile test was carried out in the same manner as in Example 1. When the tensile direction was set to the x-direction as shown in FIG. 6, and the elongation between gauge marks was adjusted to 1.4%, which corresponds to the coefficient of thermal expansion of platinum obtainable in case of increasing the temperature of platinum from room temperature to 1300° C., there was no detachment at the surface under visual inspection.

(Tensile Test 2)

Figure 14:
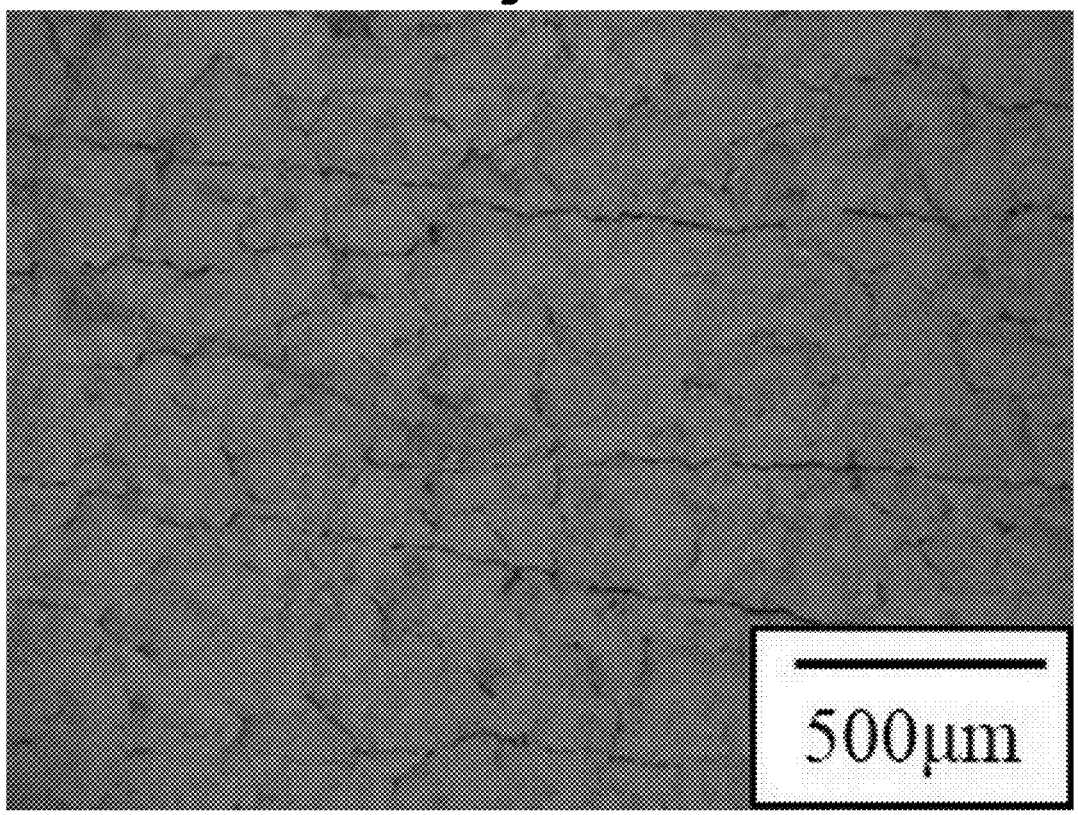
FIG. 14 is a microscope image of the surface after the tensile test of the volatilization suppressing component obtained in Example 2.
Figure 15:
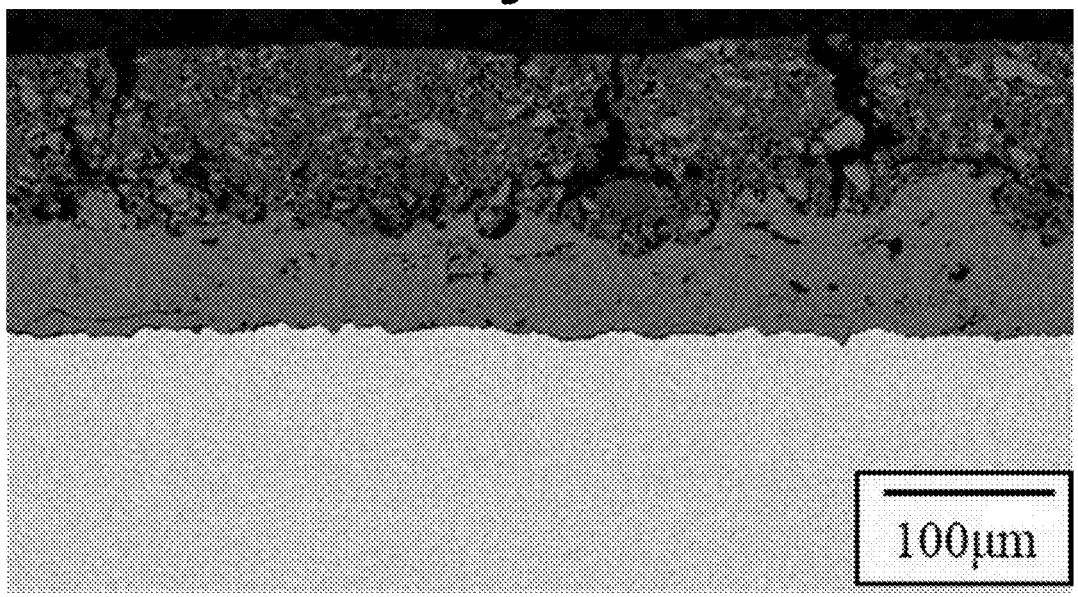
FIG. 15 is a SEM image of a cross-section after the tensile test of the volatilization suppressing component obtained in Example 2, the image being obtained by making an observation from the x-direction as in FIG. 6.
Figure 16:
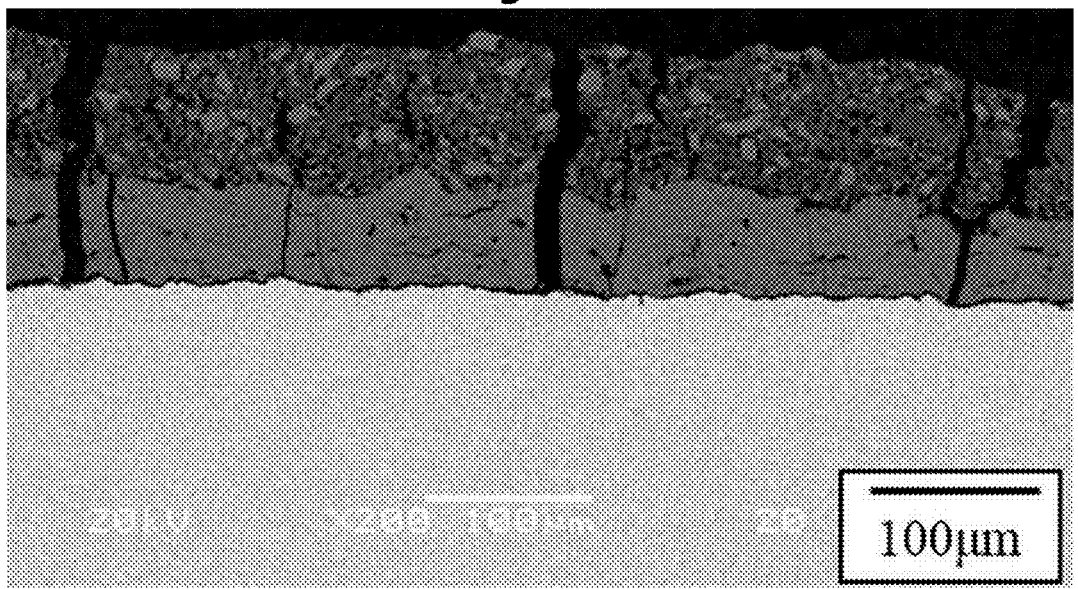
FIG. 16 is a SEM image of a cross-section after the tensile test of the volatilization suppressing component obtained in Example 2, the image being obtained by making an observation from the y-direction as in FIG. 6.

A test was carried out using an unstretched volatilization suppressing component by setting the elongation between gauge marks to 5.1%, which is more severe. The tensile direction x and the y-direction that is perpendicular to the x-direction are as shown in FIG. 6. After the tensile test, there was no detachment at the surface under visual inspection. An image of the surface of the volatilization suppressing component was captured using the microscope. The image of the surface of the volatilization suppressing component is presented in FIG. 14. Detachment at the surface of the volatilization suppressing component did not occur. Images of a cross-section of the volatilization suppressing component were captured using the SEM. An image of a cross-section of the volatilization suppressing component observed in the x-direction as in FIG. 6 is presented in FIG. 15, and an image of the cross-section observed in the y-direction is presented in FIG. 16. In the cross-section of the volatilization suppressing component observed in the x-direction, there was no detachment at the interface between the metallic base material and the first layer, and there were no cracks in an approximately vertical direction with respect to the metallic base material. In the cross-section of the volatilization suppressing component observed in the y-direction, there was no detachment at the interface between the metallic base material and the first layer; however, there were cracks in an approximately vertical direction with respect to the metallic base material. When the cross-section was observed in the y-direction, an average spacing $P_{ave}$ between cracks was 101 μm, and an average spacing $L_{ave}$ between cracks was 167 μm. Since there was no detachment at the interface between the metallic base material and the first layer, the first layer had satisfactory adhesiveness. As a result, in Example 1 and Example 2, a difference in the performance of the second layer as a protective layer due to the difference in the method of application was not observed. Regarding Example 2, images were further analyzed, and as a result, a proportion of the area occupied by the first layer that had penetrated into anchors with respect to the anchors (S2/S1) after the tensile test was 80% as observed in the x-direction and 74% as observed in the y-direction.

Comparative Example 1

(Metallic Base Material)

A metallic base material was prepared in the same manner as in Example 1.

(Thermal Spray Material)

A thermal spray material similar to that of Example 1 was used.

(Production of Volatilization Suppressing Component)

A first layer was formed on the entire surface of the metallic base material in the same manner as in Example 1 and was cooled to room temperature, and thereby a volatilization suppressing component was produced. Subsequently, in order to perform evaluation, the volatilization suppressing component was subjected to empty heating for 60 minutes at 1300° C. Regarding an electric furnace, a SiC furnace (product No. MSFT-1520, manufactured by Yamada Denki Co., Ltd.) was used. When the volatilization suppressing component was subjected to empty heating at 1300° C., the temperature was raised to 1300° C. in 5 hours, the component was maintained for one hour at 1300° C., subsequently the temperature was lowered to room temperature in 5 hours, and then the volatilization suppressing component was taken out.

(Observation of Surface of Volatilization Suppressing Component)

Figure 17:
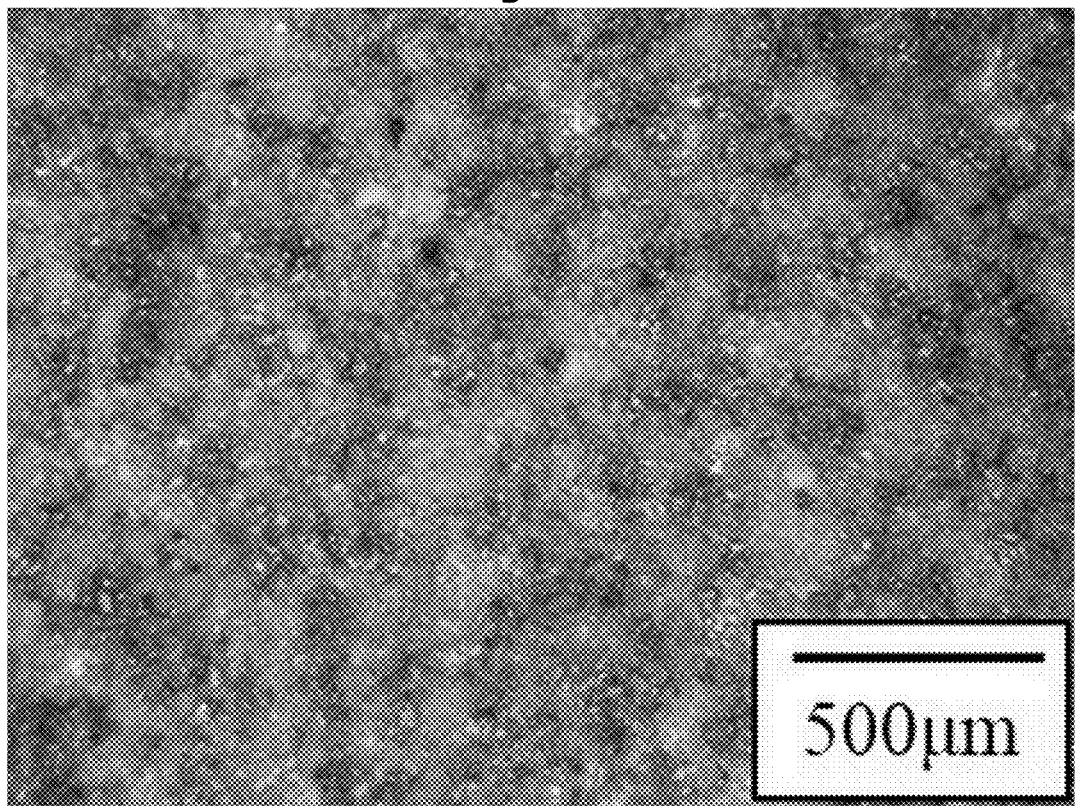
FIG. 17 is a microscope image of a surface before a tensile test of a volatilization suppressing component obtained in Comparative Example 1.

An image of a surface of the volatilization suppressing component was captured using the microscope. The image of the surface of the volatilization suppressing component is presented in FIG. 17. Detachment at the surface of the volatilization suppressing component did not occur.

(Observation of Cross-Section of Volatilization Suppressing Component)

Figure 18:
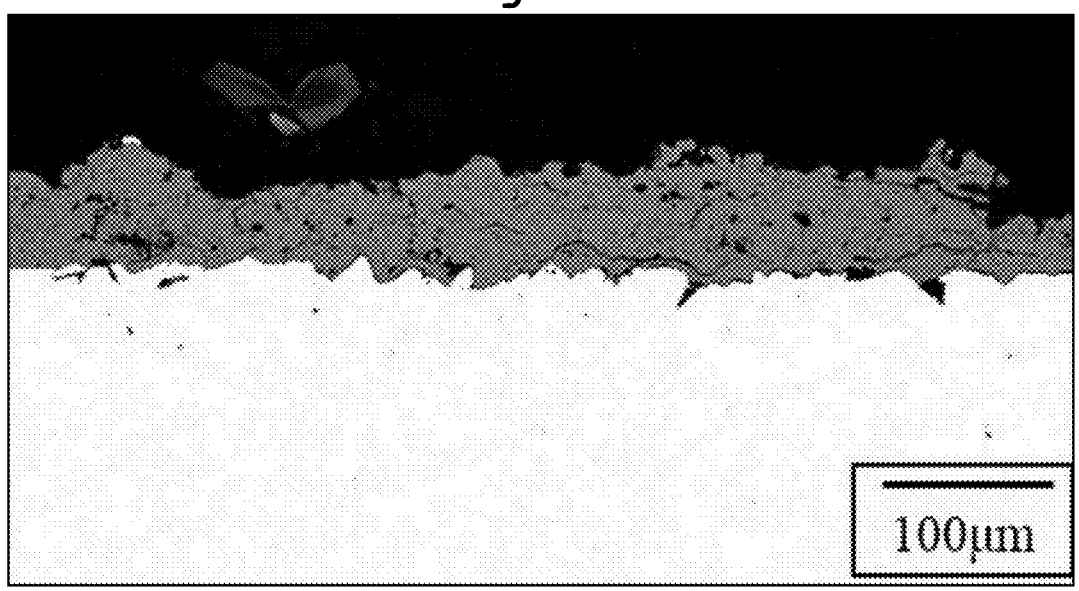
FIG. 18 is a SEM image of a cross-section before the tensile test of the volatilization suppressing component obtained in Comparative Example 1, the image being obtained by making an observation from the y-direction as in FIG. 6.

An image of a cross-section of the volatilization suppressing component was captured using the SEM. An image of a cross-section of the volatilization suppressing component observed in the y-direction as in FIG. 6 is presented in FIG. 18. With regard to the volatilization suppressing component, in the cross-section observed in the y-direction, there was no detachment at an interface between the metallic base material and the first layer, and there was no crack in an approximately vertical direction with respect to the metallic base material. In the cross-section of the volatilization suppressing component shown in FIG. 18, images of a cross-section of the boundary plane between the metallic base material and the first layer were captured using the SEM at a magnification ratio of 2000 times, an analysis was performed using five sheets of the images, and as a result, anchors and the first layer were formed in the same manner as in Example 1.

(Tensile Test 1)

A tensile test was carried out in the same manner as in Example 1. When the tensile direction was set to the x-direction as shown in FIG. 6, and the elongation between gauge marks was adjusted to 1.4%, which corresponds to the coefficient of thermal expansion of platinum obtainable in case of increasing the temperature of platinum from room temperature to 1300° C., there was no detachment at the surface under visual inspection.

(Tensile Test 2)

Figure 19:
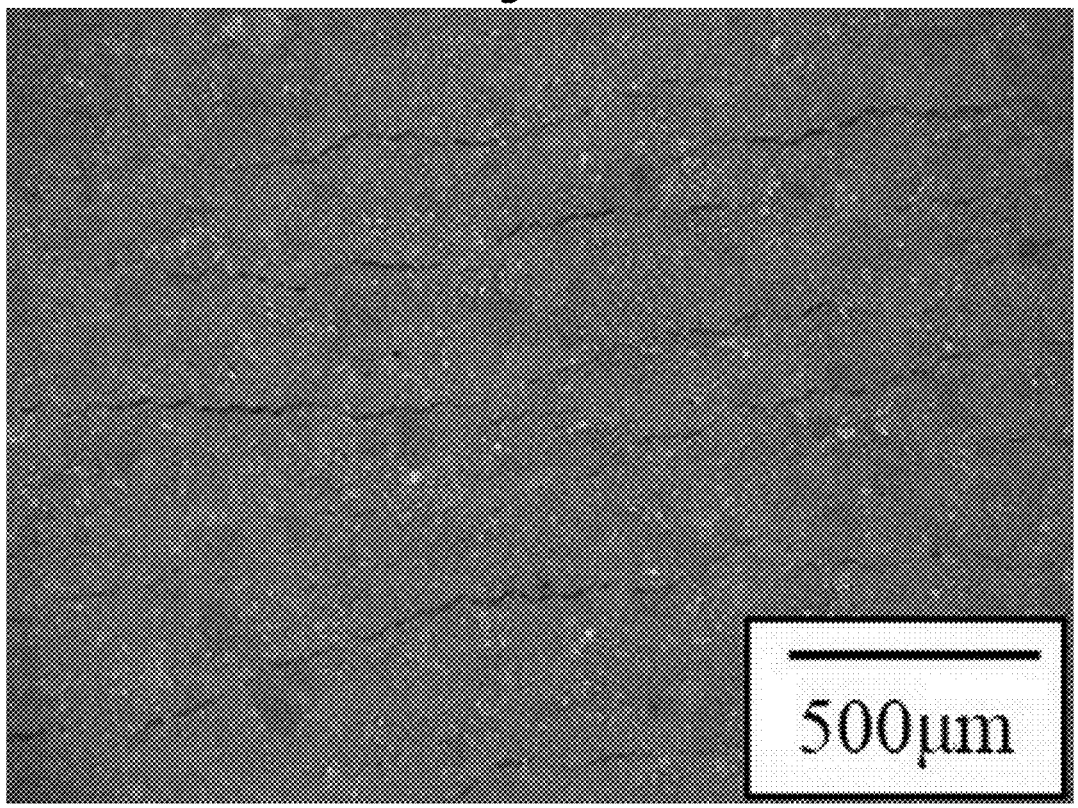
FIG. 19 is a microscope image of the surface after the tensile test of the volatilization suppressing component obtained in Comparative Example 1.
Figure 20:
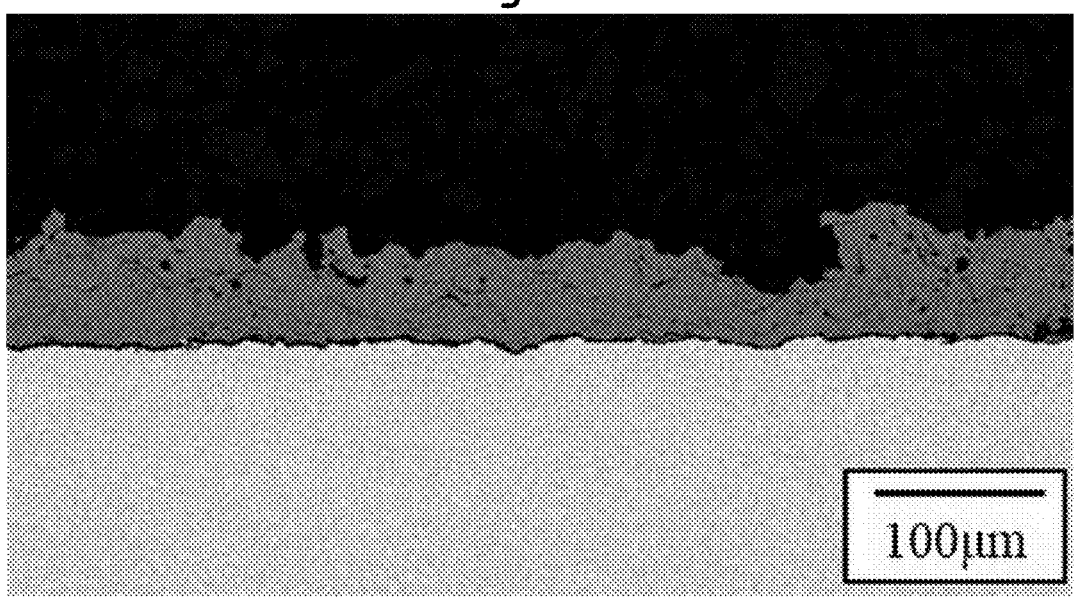
FIG. 20 is a SEM image of a cross-section after the tensile test of the volatilization suppressing component obtained in Comparative Example 1, the image being obtained by making an observation from the x-direction as in FIG. 6.
Figure 21:
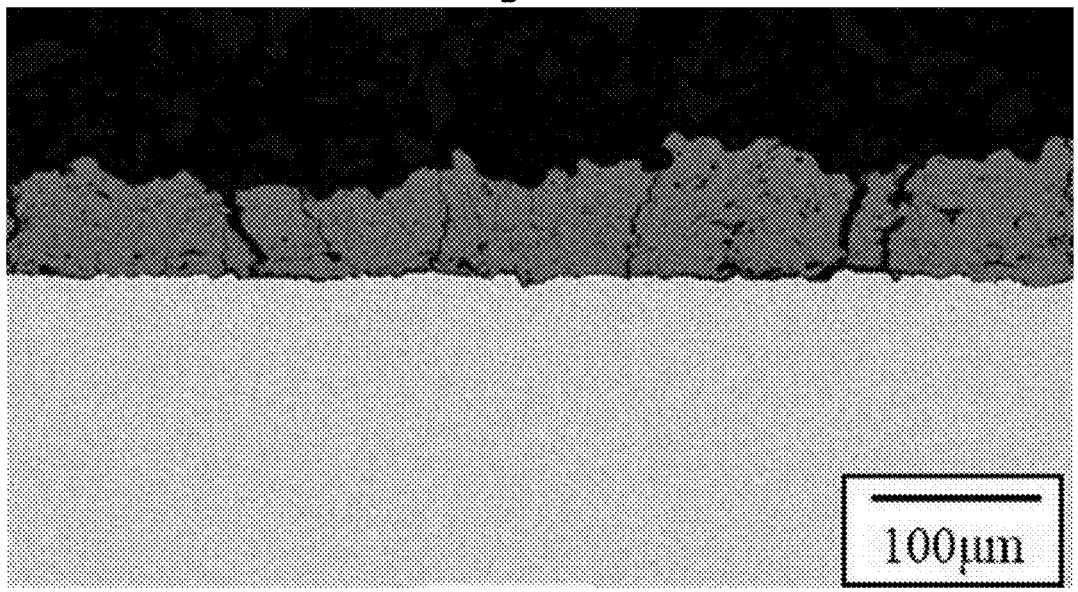
FIG. 21 is a SEM image of a cross-section after the tensile test of the volatilization suppressing component obtained in Comparative Example 1, the image being obtained by making an observation from the y-direction as in FIG. 6.

A test was carried out by setting the elongation between gauge marks to 5.3%, which is more severe, and using the volatilization suppressing component of the tensile test 1. The x-direction and the y-direction were as shown in FIG. 6. After the tensile test, there was no detachment at the surface under visual inspection. An image of the surface of the volatilization suppressing component was captured using the microscope. The image of the surface of the volatilization suppressing component is presented in FIG. 19. Detachment at the surface of the volatilization suppressing component did not occur. Images of a cross-section of the volatilization suppressing component were captured using the SEM. An image of a cross-section of the volatilization suppressing component observed in the x-direction as in FIG. 6 is presented in FIG. 20, and an image of the cross-section observed in the y-direction is presented in FIG. 21. In the cross-section of the volatilization suppressing component observed in the x-direction, there was no detachment at the interface between the metallic base material and the first layer, and cracks were almost not occurred in an approximately vertical direction with respect to the metallic base material. In the cross-section of the volatilization suppressing component observed in the y-direction, there was no detachment at the interface between the metallic base material and the first layer; however, there were cracks in an approximately vertical direction with respect to the metallic base material. When the volatilization suppressing component was observed in the y-direction, an average spacing $L_{ave}$ between cracks was 89 μm. As a result of an analysis of images, a proportion of the area occupied by the first layer that had penetrated into anchors with respect to the anchors (S2/S1) after the tensile test was 80% as observed in the x-direction and 73% as observed in the y-direction. Since there was no detachment at the interface between the metallic base material and the first layer, the first layer had satisfactory adhesiveness.

Comparative Example 2

Figure 22:
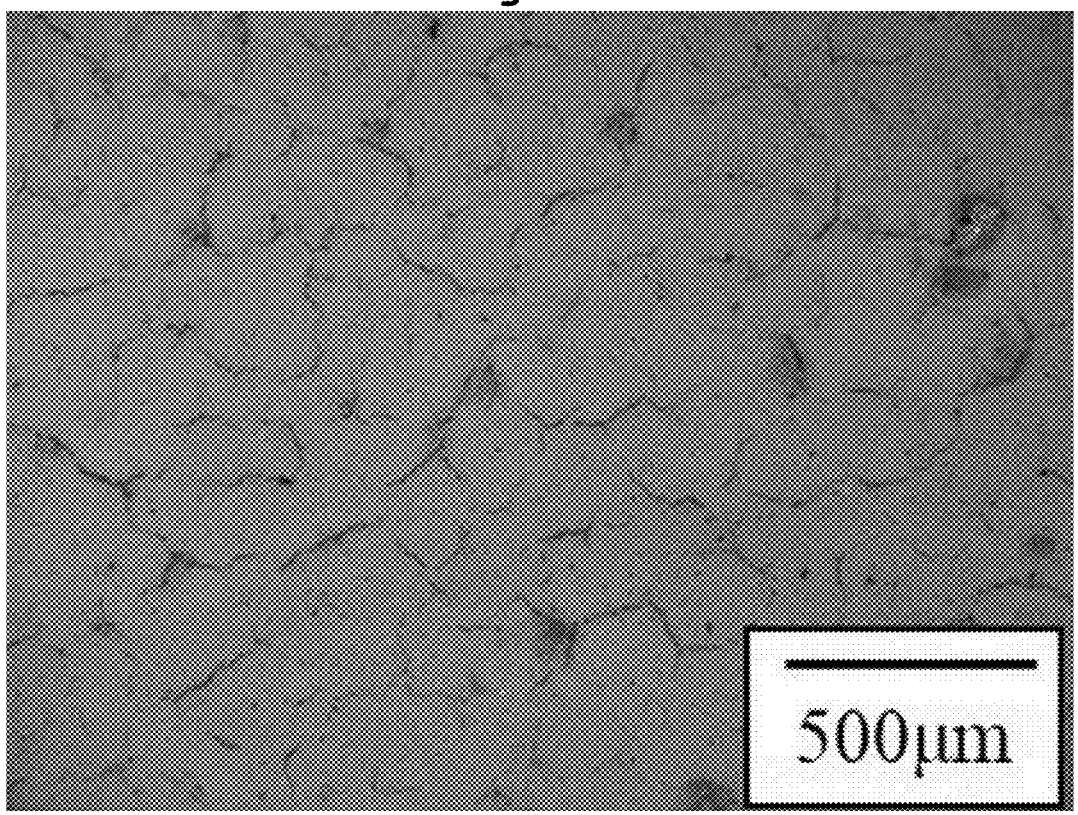
FIG. 22 is a microscope image of a surface before a tensile test of a volatilization suppressing component obtained in Comparative Example 2.
Figure 23:
FIG. 23 is a SEM image of a cross-section before the tensile test of the volatilization suppressing component obtained in Comparative Example 2, the image being obtained by making an observation from the y-direction as in FIG. 6.
Figure 24:
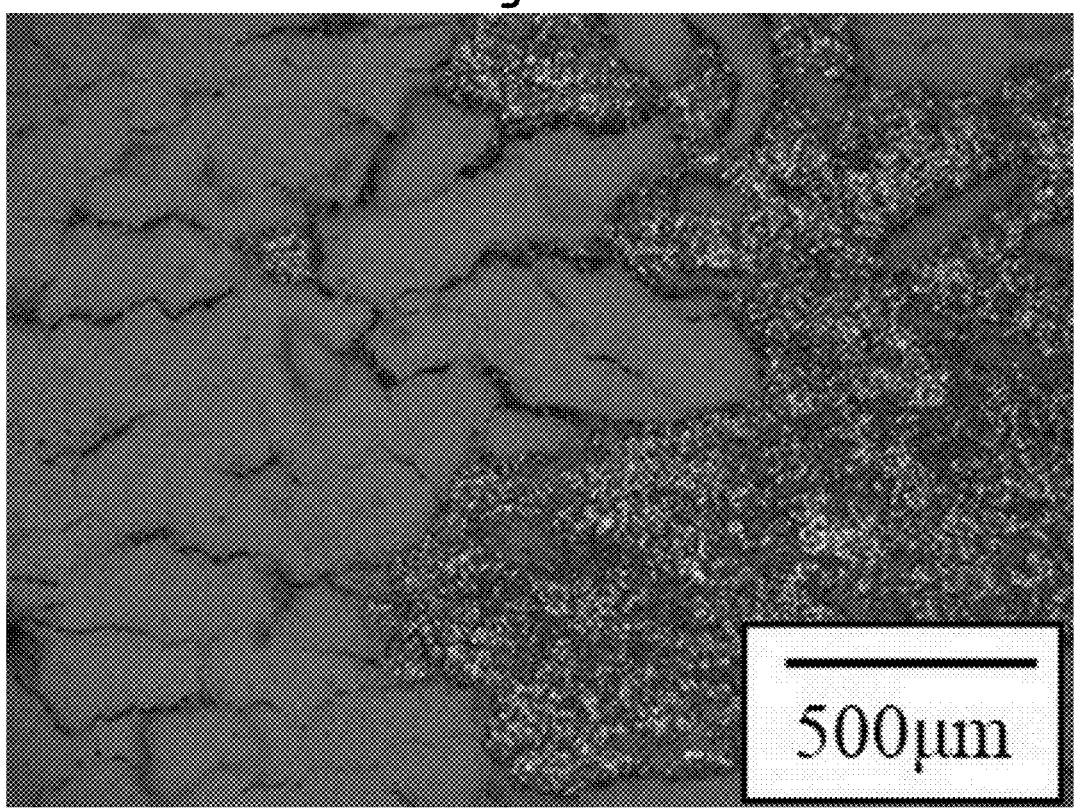
FIG. 24 is a microscope image of the surface after the tensile test of the volatilization suppressing component obtained in Comparative Example 2.
Figure 25:
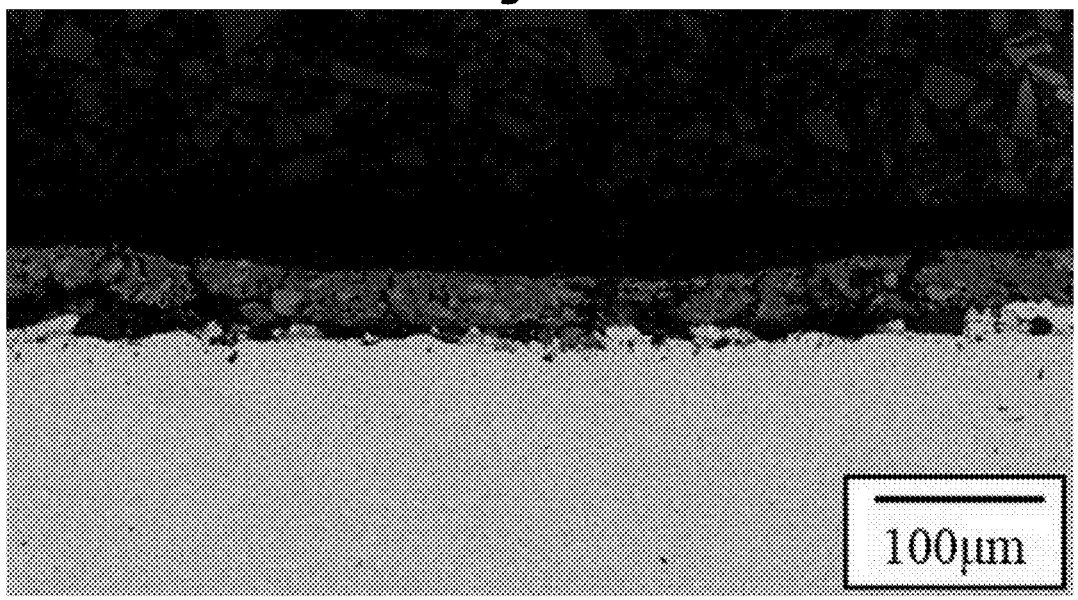
FIG. 25 is a SEM image of a cross-section after the tensile test of the volatilization suppressing component obtained in Comparative Example 2, the image being obtained by making an observation from the x-direction as in FIG. 6.
Figure 26:
FIG. 26 is a SEM image of a cross-section after the tensile test of the volatilization suppressing component obtained in Comparative Example 2, the image being obtained by making an observation from the y-direction as in FIG. 6.

(Metallic Base Material)
A metallic base material was prepared in the same manner as in Example 1.
(First Colloidal Solution and Second Solution)
A first colloidal solution and a second solution similar to those of Example 1 were used.
(Production of Volatilization Suppressing Component)
The first colloidal solution was manually applied on the entirety of a surface of the metallic base material in the longitudinal direction using a brush, and thus a first liquid layer was formed. The first liquid layer was dried by natural drying and then was maintained for 20 minutes at 150° C. using the electric furnace to dry and solidify, and thereby a coated layer was formed. After drying and solidifying, the second solution was manually applied on the entirety of a surface of the coated layer in the longitudinal direction using a brush to form a second liquid layer, the second liquid layer was naturally dried and then was maintained for 20 minutes at 100° C. using the electric furnace to dry and solidify, thereby a first layer was formed on the entirety of the surface of the metallic base material, and a volatilization suppressing component was produced. The first layer includes the coated layer and a dried and solidified product of the second liquid layer formed by applying the second solution. That is, the first layer contains components of the first colloidal solution other than the dispersing medium and components of the second solution other than the solvent. Thereafter, in order to perform evaluation, the volatilization suppressing component was subjected to empty heating in the same manner as in Example 1.
(Observation of Surface of Volatilization Suppressing Component)
An image of a surface of the volatilization suppressing component was captured using the microscope. The image of the surface of the volatilization suppressing component is presented in FIG. 22. Detachment at the surface of the volatilization suppressing component did not occur.
(Observation of Cross-Section of Volatilization Suppressing Component)
An image of a cross-section of the volatilization suppressing component was captured using the SEM. The image of the cross-section of the volatilization suppressing component observed in the y-direction as in FIG. 6 is presented in FIG. 23. With regard to the volatilization suppressing component, in the cross-section observed in the y-direction, there was no detachment at an interface between the metallic base material and the first layer; however, there were cracks in an approximately vertical direction with respect to the metallic base material. When the volatilization suppressing component was observed in the y-direction, an average spacing $L_{ave}$ between cracks was 69 μm. When the volatilization suppressing component was observed in the y-direction, in the cross-section of the volatilization suppressing component shown in FIG. 23, images of a cross-section of a boundary plane between the metallic base material and the first layer were captured using the SEM at a magnification ratio of 2000 times, an analysis was performed using five sheets of the images, and as a result, an average cross-sectional area per anchor was 38.60 μm², while a proportion of an area occupied by the first layer that had penetrated into anchors with respect to the anchors (S2/S1) was 80%. The first layer had an average porosity of 24.56%, an average particle size of 1.24 μm, and an average thickness of 40 μm.
(Tensile Test 1)
A tensile test was carried out in the same manner as in Example 1. When the tensile direction was set to the x-direction as shown in FIG. 6, and the elongation between gauge marks was adjusted to 1.4%, which corresponds to the coefficient of thermal expansion of platinum obtainable in case of increasing the temperature of platinum from room temperature to 1300° C., detachment occurred in some part of the surface under visual inspection.
(Tensile Test 2)
A test was carried out using an unstretched volatilization suppressing component by setting the elongation between gauge marks to 7.8%, which is more severe. The x-direction and the y-direction were as shown in FIG. 6. After the tensile test, detachment occurred in some part of the surface under visual inspection. An image of the surface of the volatilization suppressing component was captured using the microscope. The image of the surface of the volatilization suppressing component is presented in FIG. 24. Detachment occurred in some part of the surface of the volatilization suppressing component. Images of a cross-section of the volatilization suppressing component were captured using the SEM. An image of a cross-section of the volatilization suppressing component observed in the x-direction as in FIG. 6 is presented in FIG. 25, and an image of the cross-section observed in the y-direction is presented in FIG. 26. In the cross-section of the volatilization suppressing component observed in the x-direction, detachment occurred at the interface between the metallic base material and the first layer, and there were cracks in an approximately vertical direction with respect to the metallic base material. In the cross-section of the volatilization suppressing component observed in the y-direction, detachment occurred at the interface between the metallic base material and the first layer, and there were cracks in an approximately vertical direction with respect to the metallic base material. When the volatilization suppressing component was observed in the x-direction, an average spacing $L_{ave}$ between cracks was 77 μm. When the volatilization suppressing component was observed in the y-direction, an average spacing $L_{ave}$ between cracks was 24 μm. As a result of an analysis of images, a proportion of an area occupied by the first layer that had penetrated into anchors with respect to the anchors (S2/S1) after the tensile test was 48% as observed in the x-direction and 56% as observed in the y-direction. Since detachment occurred at the interface between the metallic base material and the first layer, the first layer had inferior adhesiveness.

Comparative Example 3

(Metallic Base Material)
A metallic base material was prepared in the same manner as in Example 1.
(First Colloidal Solution and Second Solution)
A first colloidal solution and a second solution similar to those of Example 1 were used.
(Production of Volatilization Suppressing Component)
The first colloidal solution was applied on the entirety of a surface of the metallic base material using the spray coating machine, and thus a first liquid layer was formed. The first liquid layer was dried by natural drying and then was maintained for 20 minutes at 150° C. using the electric furnace to dry and solidify, and thereby a coated layer was formed. After drying and solidifying, the second solution was manually applied on the entirety of a surface of the coated layer using a brush to form a second liquid layer. The second liquid layer was naturally dried and then was maintained for 20 minutes at 100° C. using the electric furnace to dry and solidify, thereby a first layer was formed on the entirety of the surface of the metallic base material, and a volatilization suppressing component was produced. The first layer includes the coated layer and a dried and solidified product of the second liquid layer formed by applying the second solution. That is, the first layer contains components of the first colloidal solution other than the dispersing medium and components of the second solution other than the solvent. Thereafter, in order to perform evaluation, the volatilization suppressing component was subjected to empty heating in the same manner as in Example 1.

(Observation of Surface of Volatilization Suppressing Component)

Figure 27:
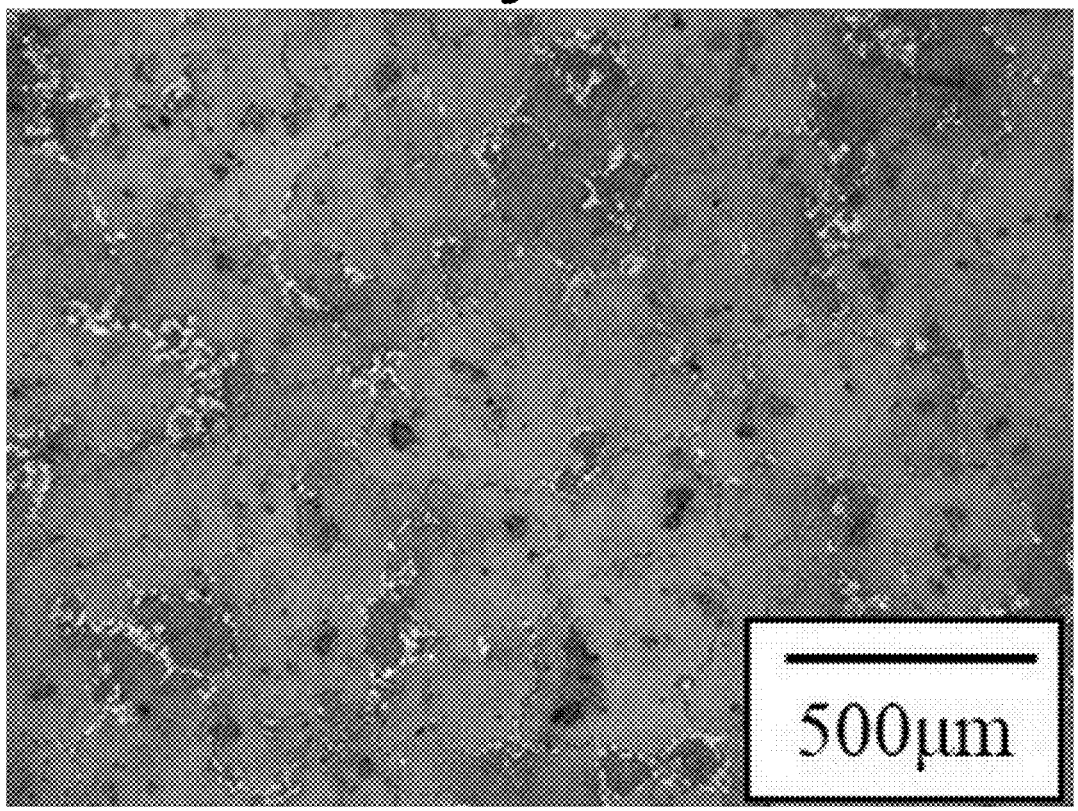
FIG. 27 is a microscope image of a surface before a tensile test of a volatilization suppressing component obtained in Comparative Example 3.

An image of the surface of the volatilization suppressing component was captured using the microscope. The image of the surface of the volatilization suppressing component is presented in FIG. 27. Detachment at the surface of the volatilization suppressing component did not occur.

(Observation of Cross-Section of Volatilization Suppressing Component)

Figure 28:
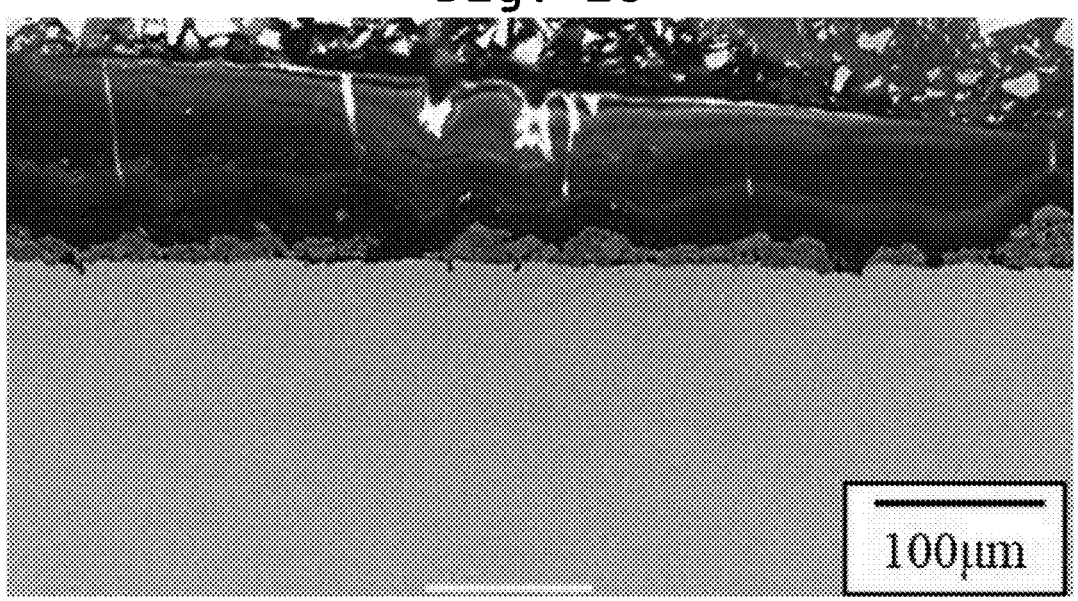
FIG. 28 is a SEM image of a cross-section before the tensile test of the volatilization suppressing component obtained in Comparative Example 3, the image being obtained by making an observation from the y-direction as in FIG. 6.

An image of a cross-section of the volatilization suppressing component was captured using the SEM. The image of the cross-section of the volatilization suppressing component observed in the y-direction as in FIG. 6 is presented in FIG. 28. With regard to the volatilization suppressing component, in the cross-section observed in the y-direction, detachment occurred in some part of an interface between the metallic base material and the first layer, and thereby the surface of the metallic base material was exposed. When the volatilization suppressing component was observed in the y-direction, an average spacing $L_{ave}$ between the exposed parts was 71 µm. In the cross-section of the volatilization suppressing component shown in FIG. 28, images of a cross-section of a boundary plane between the metallic base material and the first layer were captured using the SEM at a magnification ratio of 2000 times, an analysis was performed using five sheets of the images, and as a result, an average cross-sectional area per anchor was 66.07 µm², while a proportion of an area occupied by the first layer that had penetrated into anchors with respect to the anchors (S2/S1) was 56.88%. The first layer had an average porosity of 17.69%, an average particle size of 1.13 µm, and an average thickness of 39 µm.

(Tensile Test 1)

A tensile test was carried out in the same manner as in Example 1. When the tensile direction was set to the x-direction as shown in FIG. 6, and the elongation between gauge marks was adjusted to 1.4%, which corresponds to the coefficient of thermal expansion of platinum obtainable in case of increasing the temperature of platinum from room temperature to 1300° C., there was no detachment at the surface under visual inspection.

(Tensile Test 2)

Figure 29:
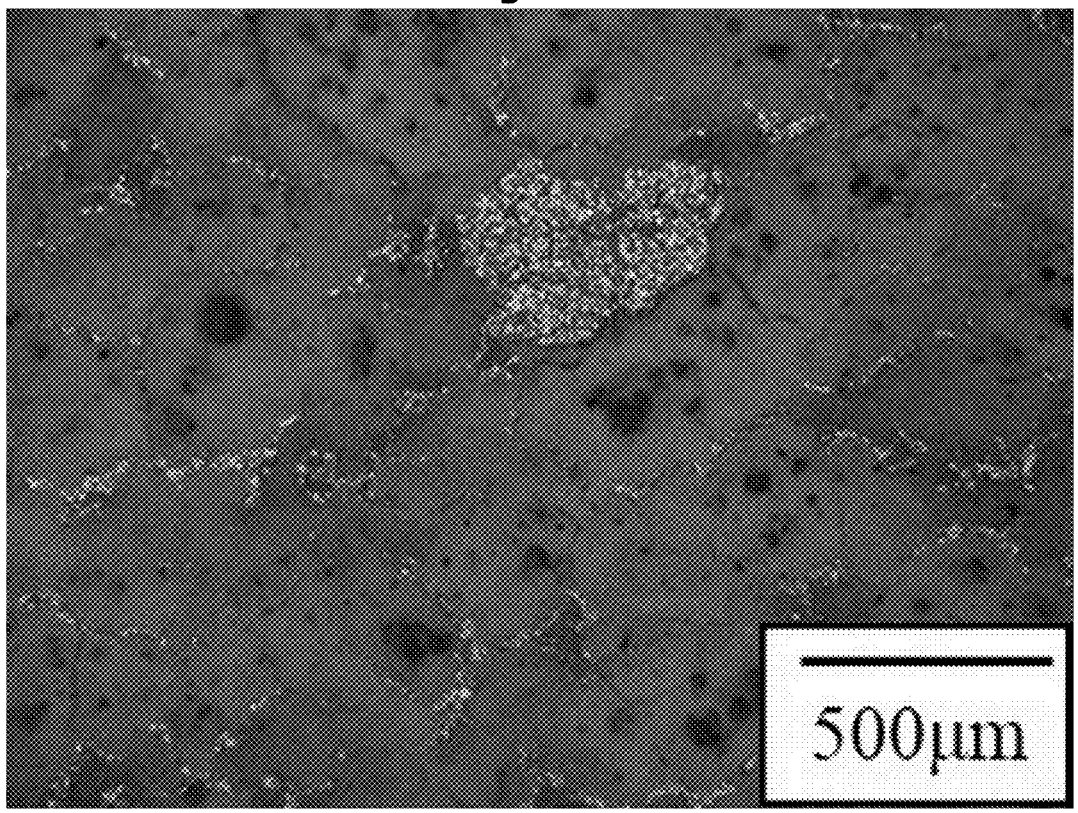
FIG. 29 is a microscope image of the surface after the tensile test of the volatilization suppressing component obtained in Comparative Example 3.
Figure 30:
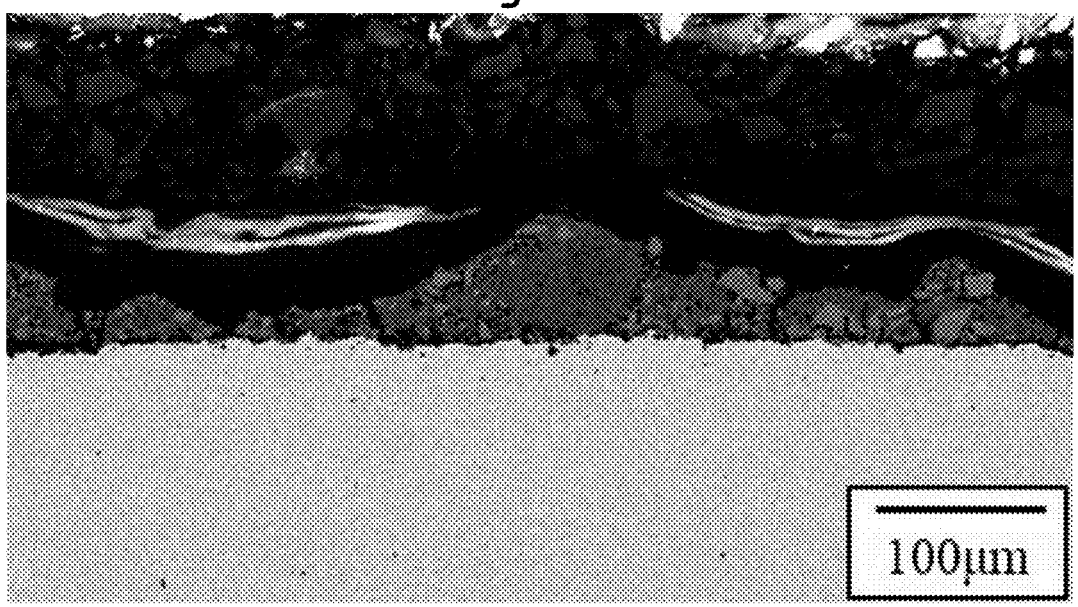
FIG. 30 is a SEM image of a cross-section after the tensile test of the volatilization suppressing component obtained in Comparative Example 3, the image being obtained by making an observation from the x-direction as in FIG. 6.
Figure 31:
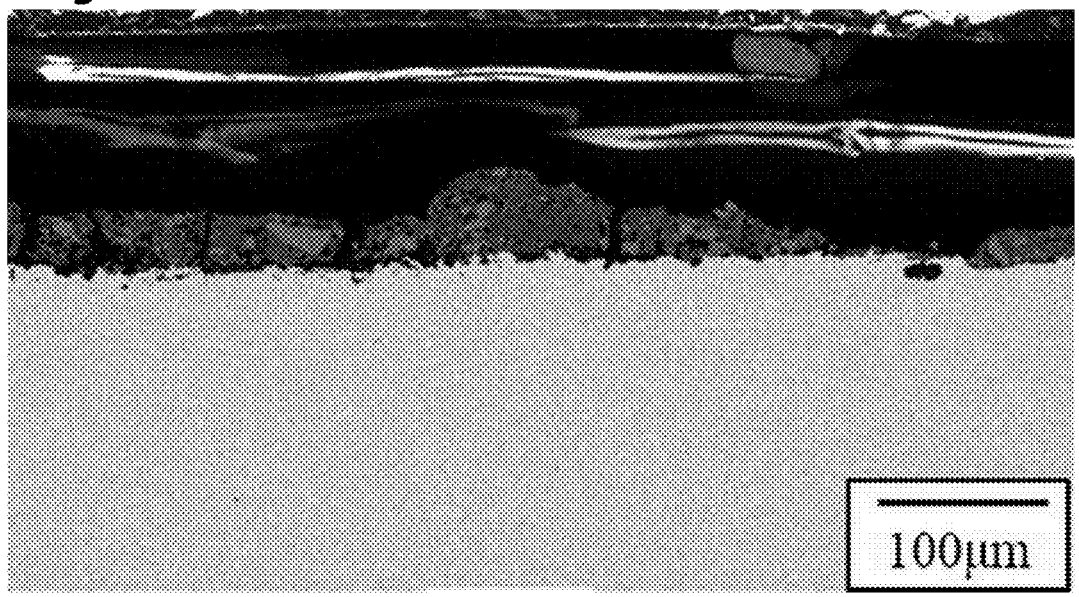
FIG. 31 is a SEM image of a cross-section after the tensile test of the volatilization suppressing component obtained in Comparative Example 3, the image being obtained by making an observation from the y-direction as in FIG. 6.

A test was carried out by setting the elongation between gauge marks to 5.2%, which is more severe, and using the volatilization suppressing component of the tensile test 1. The x-direction and the y-direction were as shown in FIG. 6. After the tensile test, there was no detachment at the surface under visual inspection. An image of the surface of the volatilization suppressing component was captured using the microscope. The image of the surface of the volatilization suppressing component is presented in FIG. 29. Detachment occurred in some part of the surface of the volatilization suppressing component. Images of a cross-section of the volatilization suppressing component were captured using the SEM. An image of a cross-section of the volatilization suppressing component observed in the x-direction as in FIG. 6 is presented in FIG. 30, and an image of the cross-section observed in the y-direction is presented in FIG. 31. In the cross-section of the volatilization suppressing component observed in the x-direction, detachment occurred at the interface between the metallic base material and the first layer, the surface of the metallic base material was exposed, and there were cracks in an approximately vertical direction with respect to the metallic base material at the site where the first layer was attached. Also, in the cross-section of the volatilization suppressing component observed in the y-direction, detachment occurred at the interface between the metallic base material and the first layer, the surface of the metallic base material was exposed, and there were cracks in an approximately vertical direction with respect to the metallic base material at the site where the first layer was attached. When the volatilization suppressing component was observed in the x-direction, an average spacing $L_{ave}$ between the exposed parts was 82 µm. When the volatilization suppressing component was observed in the y-direction, an average spacing $L_{ave}$ between the exposed parts was 54 µm. As a result of an analysis of the images, a proportion of an area occupied by the first layer that had penetrated into anchors with respect to the anchors (S2/S1) after the tensile test was 42% as observed in the x-direction and 46% as observed in the y-direction. Since detachment occurred at the interface between the metallic base material and the first layer, the first layer had inferior adhesiveness.

(X-Ray Diffraction)

With regard to the laminated films of Example 1 and Example 2 and the first layers of Comparative Example 1 to Comparative Example 3, each crystal structure was analyzed by X-ray diffraction. The crystal structure of the first layers of Example 1, Example 2, and Comparative Example 1 was yttria-stabilized $ZrO_2$ tetragonal, and the crystal structure of the second layers of Example 1 and Example 2 and the first layers of Comparative Example 2 and Comparative Example 3 was $Zr(SiO_4)$ tetragonal and $ZrO_2$ monoclinic.

From the results of observation of the surfaces and cross-sections of the volatilization suppressing components, in each volatilization suppressing component obtained in Example 1 and Example 2, it was found that detachment of the surface of the volatilization suppressing component was prevented by the first layer serving as an adhesive layer, and the propagation of cracks in an approximately vertical direction with respect to the metallic base material, the cracks reaching to the surface of the volatilization suppressing component, was satisfactorily suppressed by the second layer serving as a protective layer. Before the tensile test, since the S2/S1 of Example 1 and Example 2 was higher than the S2/S1 of Comparative Example 2 and Comparative Example 3, it is considered that when it is said that the S2/S1 is high, the adhesiveness between the metallic base material and the first layer is enhanced, that is, the high ratio is one of the factors that prevent detachment of the surface of the volatilization suppressing component. Between Example 1 and Example 2, there was a slight difference in the average number of cracks in an approximately vertical direction with respect to the metallic base material occurring in the first layer; however, the performance of the second layer as a protective layer was equal irrespective of the method of application of the second layer. On the other hand, in Comparative Example 1, since there was not any layer present on the first layer, suppression of the propagation of cracks was not satisfactory. In Comparative Example 2, since the first layer had poor adhesiveness, the surface of the volatilization suppressing component was detached, and since there was not any layer present on the first layer, suppression of the propagation of cracks was not satisfactory. In Comparative Example 3, since the first layer had poorer adhesiveness, the surface of the volatilization suppressing component was detached, and the surface of the metallic base material was exposed, and since there was not any layer present on the first layer, suppression of the propagation of cracks was not satisfactory.

Example 3

(Metallic Base Material)
A metallic base material made of platinum (manufactured by Furuya Metal Co., Ltd.) that measured 20 mm in length× 20 mm in width×1.3 mm in thickness, was prepared.
(Thermal Spray Material)
A thermal spray material similar to that of Example 1 was used.
(First Colloidal Solution and Second Solution)
A first colloidal solution and a second solution similar to those of Example 1 were used.
(Production of Volatilization Suppressing Component)
The first layer was formed in the same manner as in Example 2. The metallic base material having the first layer formed thereon was cooled to room temperature, subsequently a second layer was formed in the same manner as in Example 2, except that the site of formation was changed from on the region C in the first layer to on the entirety of the first layer, and a volatilization suppressing component was produced. Thereafter, in order to perform evaluation, the volatilization suppressing component was subjected to empty heating in the same manner as in Example 1.

Comparative Example 4

(Metallic Base Material)
A metallic base material was prepared in the same manner as in Example 3.
(Thermal Spray Material)
A thermal spray material similar to that of Example 1 was used.
(Production of Volatilization Suppressing Component)
A first layer was formed on the entirety of a surface of the metallic base material in the same manner as in Example 1 and was cooled to room temperature, and thereby a volatilization suppressing component was produced. Thereafter, in order to perform evaluation, the volatilization suppressing component was subjected to empty heating in the same manner as in Example 1.

Comparative Example 5

(Metallic Base Material)
A metallic base material was prepared in the same manner as in Example 3.
(First Colloidal Solution and Second Solution)
A first colloidal solution and a second solution similar to those of Example 1 were used.
(Production of Volatilization Suppressing Component)
The first colloidal solution was applied on the entirety of a surface of the metallic base material using the spray coating machine, and thus a first liquid layer was formed. The first liquid layer was dried by natural drying and then was maintained for 20 minutes at 150° C. using an electric furnace to dry and solidify, and thereby a coated layer was formed. After drying and solidifying, the second solution was manually applied on the entirety of a surface of the coated layer using a brush to form a second liquid layer. The second liquid layer was naturally dried and then was maintained for 20 minutes at 100° C. using the electric furnace to dry and solidify, thereby a first layer was formed on the entirety of the surface of the metallic base material, and a volatilization suppressing component was produced. The first layer includes the coated layer and a dried and solidified product of the second liquid layer formed by applying the second solution. That is, the first layer contains components of the first colloidal solution other than the dispersing medium and components of the second solution other than the solvent. Thereafter, in order to perform evaluation, the volatilization suppressing component was subjected to empty heating in the same manner as in Example 1.

Comparative Example 6

(Metallic Base Material)
A metallic base material was prepared in the same manner as in Example 3, and this was used as a sample without a coating layer.
(Volatilization Test)
One each of the volatilization suppressing components of Example 3 and Comparative Example 4 to Comparative Example 6 was prepared, and their masses were individually measured. Regarding the electric furnace, a SiC furnace (product No. MSFT-1520, manufactured by Yamada Denki Co., Ltd.) was used. A volatilization test was carried out by adopting an air atmosphere inside the furnace. In the volatilization test, first, one each of the volatilization suppressing components of Example 3 and Comparative Example 4 to Comparative Example 6 was introduced into the furnace, the temperature in the furnace was raised to 1500° C. for 5 hours, and the time when 1500° C. was reached was designated as test time zero. Subsequently, the samples were maintained for 100 hours at 1500° C., subsequently the temperature was lowered to room temperature for 5 hours, the volatilization suppressing components of Example 3 and Comparative Example 4 to Comparative Example 6 were taken out from the inside of the furnace, and the masses were measured. The volatilization suppressing components for which measurement had been completed were repeatedly subjected to a volatilization test by a similar procedure, subsequently similar measurement was repeated at the timing where the cumulative time for which the components had been maintained at 1500° C. was 300, 500, 700, 1000, and 1200 hours, the samples after 1200 hours were not reintroduced into the furnace, and the volatilization test was completed as it was. The volatilization rate at the time when the cumulative time at the time point of measuring the masses was n hours was calculated using the formula represented by the following Mathematical Formula 1. The average volatilization speed was calculated using the formula represented by the following Mathematical Formula 2. After 1200 hours, with respect to a case where the volatilization rate of the metallic base material of Comparative Example 6 was designated as 100%, the volatilization suppressing component obtained in Example 3 was 62% suppressed, the volatilization suppressing component obtained in Comparative Example 4 was 36% suppressed, and the volatilization suppressing component obtained in Comparative Example 5 was 16% suppressed.

[Mathematical Formula 1]

$$\text{Volatilization rate obtained when cumulative time is } n \text{ hours [\%]} = \frac{\text{Mass before volatilization test [mg]} - \text{Mass obtained when cumulative time is } n \text{ hours [mg]}}{\text{Mass before volatilization test [mg]}} \times 100$$

[Mathematical Formula 2]

$$\text{Average volatilization speed [mg/cm}^2\text{/hr]} = \frac{\text{Mass before volatilization test [mg]} - \text{Mass obtained when cumulative time is } n \text{ hours [mg]}}{\text{Surface area of volatilization suppressing component [cm}^2\text{]} \times \text{Cumulative time } n \text{ [hr]}}$$

Figure 32:
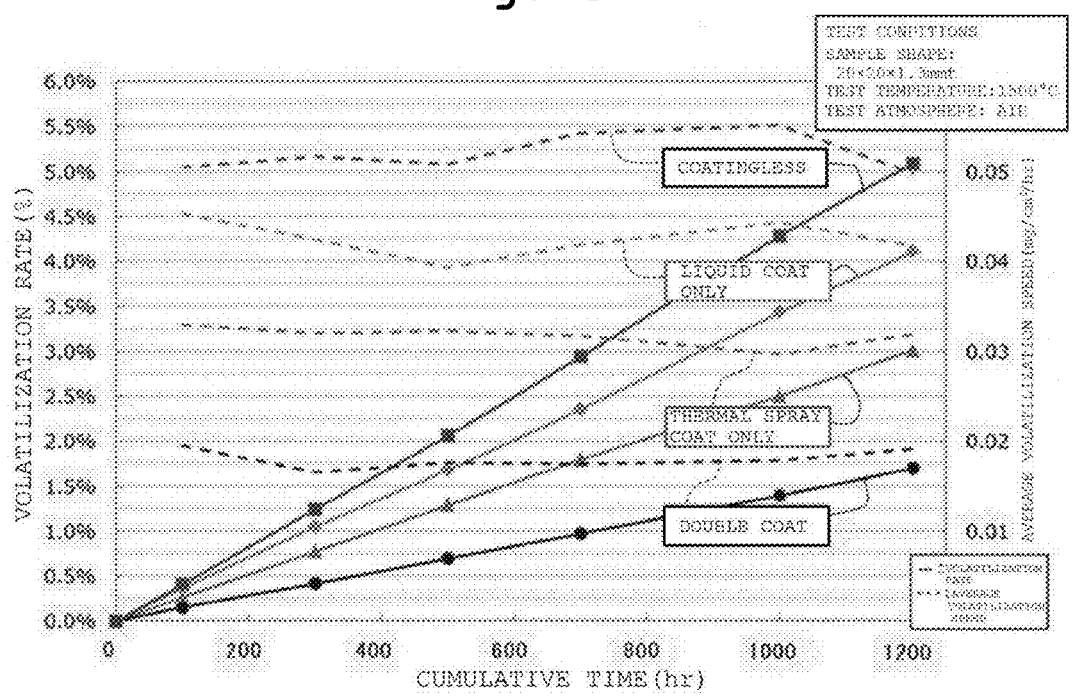
FIG. 32 is a graph showing a relationship of a volatilization rate and an average volatilization speed with respect to a cumulative time of a volatilization test (Example 3, Comparative Example 4 to Comparative Example 6).

A relationship between the volatilization rate and the average volatilization speed with respect to the volatilization test time is shown in FIG. 32. In FIG. 32, Double coat is Example 3, Thermal spray coat only is Comparative Example 4, Liquid coat only is Comparative Example 5, and Coatingless is Comparative Example 6. As is obvious from the results of FIG. 32, in Example 3, oxidative volatilization was satisfactorily suppressed. On the other hand, in Comparative Example 4 and Comparative Example 5, since there was not any layer present on the first layer, suppression of the oxidative volatilization was not satisfactory. In Comparative Example 6, since a coating layer was not present at all, suppression of the oxidative volatilization was not satisfactory.

[Metallic Base Material Made of Iridium]

Example 4

(Metallic Base Material)

A metallic base material made of iridium (manufactured by Furuya Metal Co., Ltd.) that measured 20 mm in length× 20 mm in width×1 mm in thickness, was prepared.

(Thermal Spray Material)

As a thermal spray material, yttria-stabilized zirconia (containing 2 to 8% by mass of yttrium oxide, particle size 10 to 75 µm) was used.

(First Colloidal Solution and Second Solution)

A dispersion liquid of a zirconium compound having water as a dispersing medium and containing 70 to 80% by mass of a zirconium compound and 1 to 10% by mass of an alkali metal silicate (RUSTAFF 6110, manufactured by ACCESS Co., Ltd.) was used as a first colloidal solution. Furthermore, a solution of a metal alkoxide compound including isopropanol as a main component of the solvent and containing silicon alkoxide and zirconium alkoxide (RUSTAFF 6120, manufactured by ACCESS Co., Ltd.) was used as a second solution.

(Production of Volatilization Suppressing Component)

The thermal spray material was sprayed on the entirety of a surface of the metallic base material using a plasma thermal spraying apparatus, and thereby a first layer was formed. The first colloidal solution was applied on the entirety of the first layer using a spray coating machine (product No. W-100, manufactured by ANEST IWATA Corp.) to form a first liquid layer. The first liquid layer was naturally dried and then was maintained at 150° C. for 20 minutes using the electric furnace. Thereby, the first liquid layer was dried and solidified, and thus a coated layer was formed. After drying and solidifying, the second solution was manually applied on the entirety of a surface of the coated layer in the longitudinal direction using a brush, and thus a second liquid layer was formed. After the second liquid layer was naturally dried, the second liquid layer was maintained at 100° C. for 20 minutes using the electric furnace. In this way, the second liquid layer was dried and solidified to form a second layer on the entirety of the first layer, and a volatilization suppressing component was produced. The second layer includes the coated layer and a dried and solidified product of the second liquid layer formed by applying the second solution. That is, the second layer contains components of the first colloidal solution other than the dispersing medium and components of the second solution other than the solvent.

(Observation of Surface of Volatilization Suppressing Component)

Figure 33:
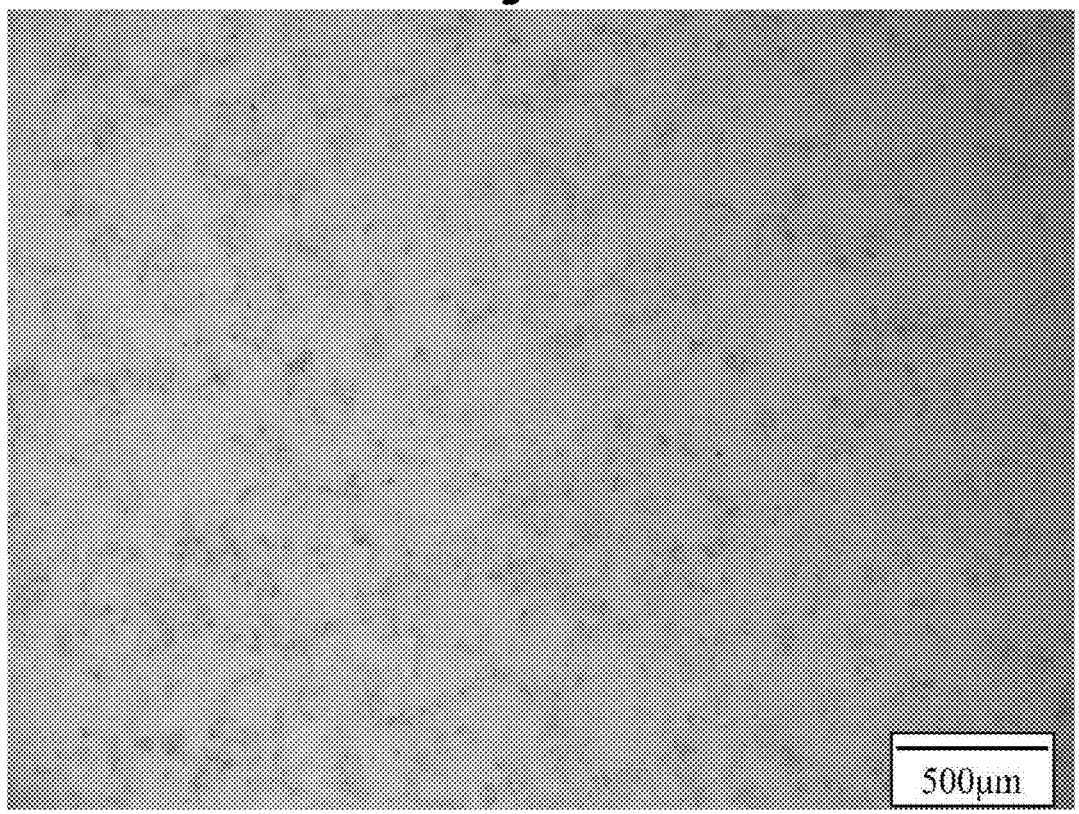
FIG. 33 is a microscope image of a surface of a volatilization suppressing component obtained in Example 4.

An image of the surface of the volatilization suppressing component was captured using a microscope (product No. VHX-1000, manufactured by Keyence Corp.). The image of the surface of the volatilization suppressing component is presented in FIG. 33. Detachment at the surface of the volatilization suppressing component did not occur.

(Observation of Cross-Section of Volatilization Suppressing Component)

Figure 34:
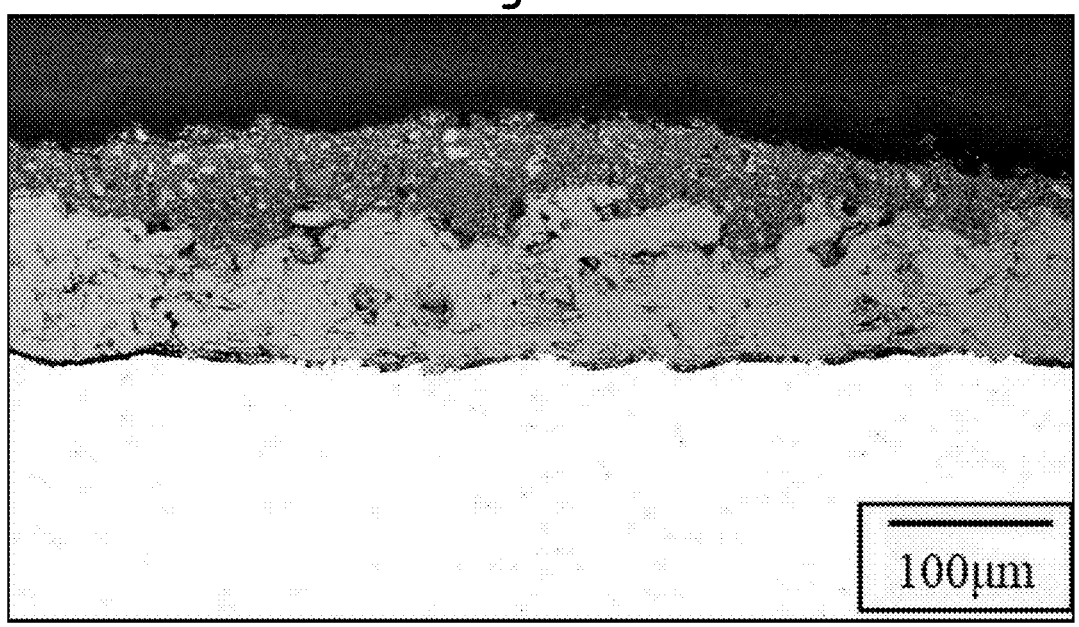
FIG. 34 is a SEM image of a cross-section of the volatilization suppressing component obtained in Example 4, the image being obtained by making an observation from the y-direction as in FIG. 6.

An image of a cross-section of the volatilization suppressing component was captured using the SEM. The image of the cross-section of the volatilization suppressing component observed in the y-direction as in FIG. 6 is presented in FIG. 34. With regard to the volatilization suppressing component, in the cross-section observed in the y-direction, there was no detachment at an interface between the metallic base material and the first layer, and there was no crack in an approximately vertical direction with respect to the metallic base material. In the cross-section of the volatilization suppressing component shown in FIG. 34, images of a cross-section of a boundary plane between the metallic base material and the first layer were captured using the SEM at a magnification ratio of 2000 times, an analysis was performed using five sheets of the images, and as a result, an average cross-sectional area per anchor was 327.90 µm², while a proportion of an area occupied by the first layer that had penetrated into anchors with respect to the anchors (S2/S1) was 93.5%. The first layer had an average porosity of 3.65%, an average particle size of 4.84 µm, and an average thickness of 81 µm. The second layer had an average porosity of 23.76%, an average particle size of 1.06 µm, and an average thickness of 51 µm.

Comparative Example 7

(Metallic Base Material)

A metallic base material was prepared in the same manner as in Example 4.

(Thermal Spray Material)

A thermal spray material similar to that of Example 4 was used.

(Production of Volatilization Suppressing Component)

A first layer was formed on the entirety of a surface of the metallic base material in the same manner as in Example 4 and was cooled to room temperature, and thereby a volatilization suppressing component was produced.

(Observation of Surface of Volatilization Suppressing Component)

Figure 35:
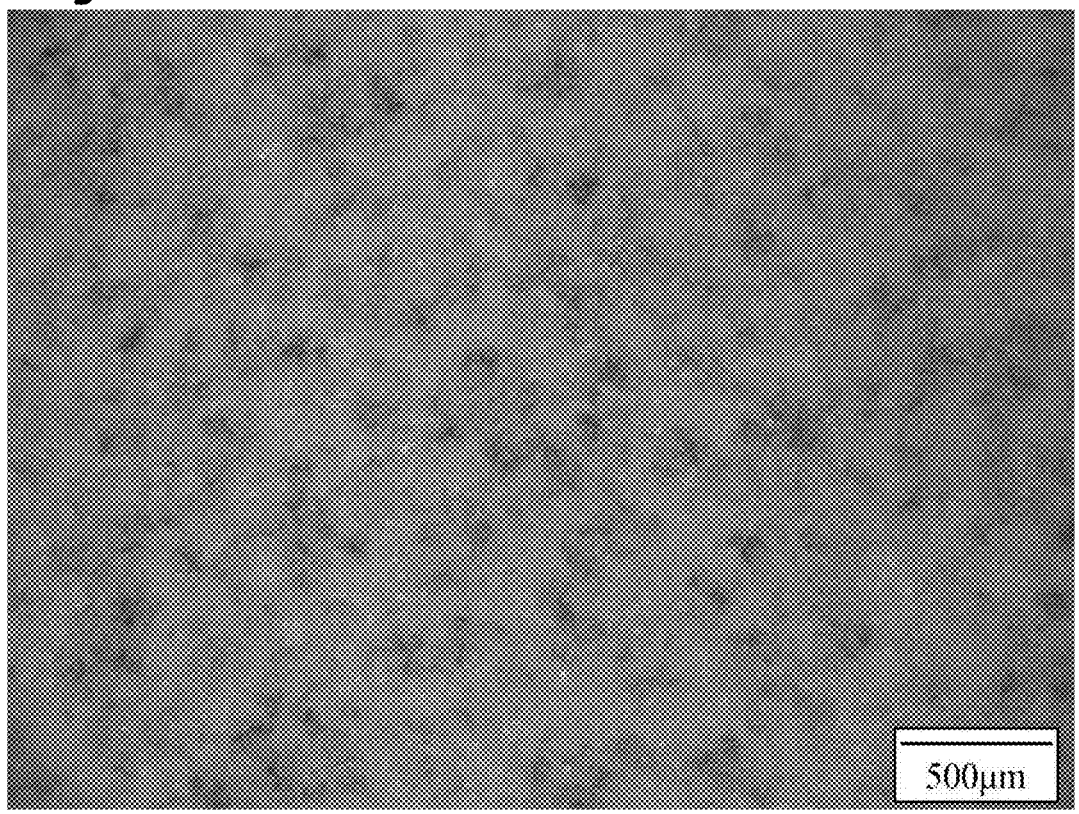
FIG. 35 is a microscope image of a surface of a volatilization suppressing component obtained in Comparative Example 7.

An image of the surface of the volatilization suppressing component were captured using the microscope. The image of the surface of the volatilization suppressing component is presented in FIG. 35. Detachment at the surface of the volatilization suppressing component did not occur.

(Observation of Cross-Section of Volatilization Suppressing Component)

Figure 36:
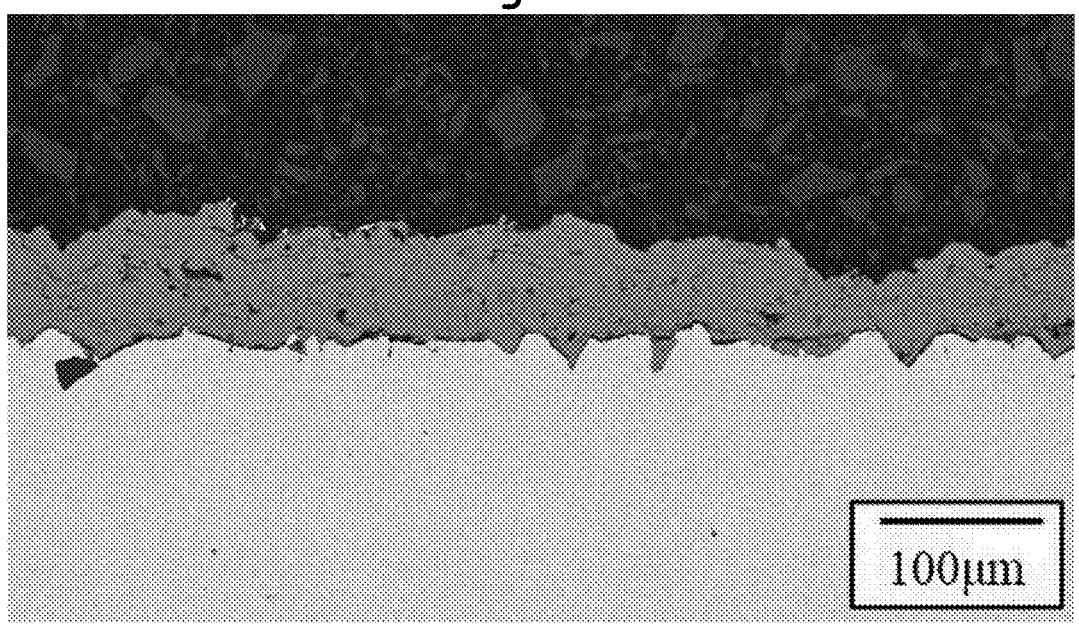
FIG. 36 is a SEM image of a cross-section of the volatilization suppressing component obtained in Comparative Example 7, the image being obtained by making an observation from the y-direction as in FIG. 6.

An image of a cross-section of the volatilization suppressing component was captured using the SEM. The image of a cross-section of the volatilization suppressing component observed in the y-direction as in FIG. 6 is presented in FIG. 36. With regard to the volatilization suppressing component, in the cross-section observed in the y-direction, there was no detachment at the interface between the metallic base material and the first layer, and there was no crack in an approximately vertical direction with respect to the metallic base material. In the cross-section of the volatilization suppressing component shown in FIG. 36, images of a cross-section of the boundary plane between the metallic base material and the first layer were captured using the SEM at a magnification ratio of 2000 times, an analysis was performed using five sheets of the images, and as a result, anchors and the first layer were formed in the same manner as in Example 4.

Comparative Example 8

(Metallic Base Material)

A metallic base material was prepared in the same manner as in Example 4, and this was used as a sample without a coating layer.

(Volatilization Test)

One each of the volatilization suppressing components of Example 4 and Comparative Example 7 to Comparative Example 8 was prepared, and their masses were individually measured. Regarding the electric furnace, a SiC furnace (product No. MSFT-1520, manufactured by Yamada Denki Co., Ltd.) was used. A volatilization test was carried out by adopting an air atmosphere inside the furnace. In the volatilization test, first, the temperature in the furnace was raised to 1500° C. for 2 hours, when the temperature reached 1500° C., one each of the volatilization suppressing components of Example 4 and Comparative Example 7 to Comparative Example 8 was introduced into the furnace, and the time when the samples were introduced was designated as test time zero. Subsequently, the samples were maintained at 1500° C. for any arbitrary time and then were taken out from the furnace, the samples were cooled in air to room temperature, and the masses were measured. The volatilization suppressing components for which measurement had been completed were repeatedly subjected to a volatilization test by a similar procedure, subsequently similar measurement was repeated until the cumulative time for which the components had been maintained at 1500° C. was 1000 hours, the samples after 1000 hours were not reintroduced into the furnace, and the volatilization test was completed as it was. The volatilization rate at the time when the cumulative time at the time point of measuring the masses was n hours was calculated using the formula represented by Mathematical Formula 1. The average volatilization speed was calculated using the formula represented by Mathematical Formula 2. After 1000 hours, with respect to a case where the volatilization rate of the metallic base material of Comparative Example 8 was designated as 100%, the volatilization suppressing component obtained in Example 4 was 93% suppressed, and the volatilization suppressing component obtained in Comparative Example 7 was 87% suppressed.

Figure 37:
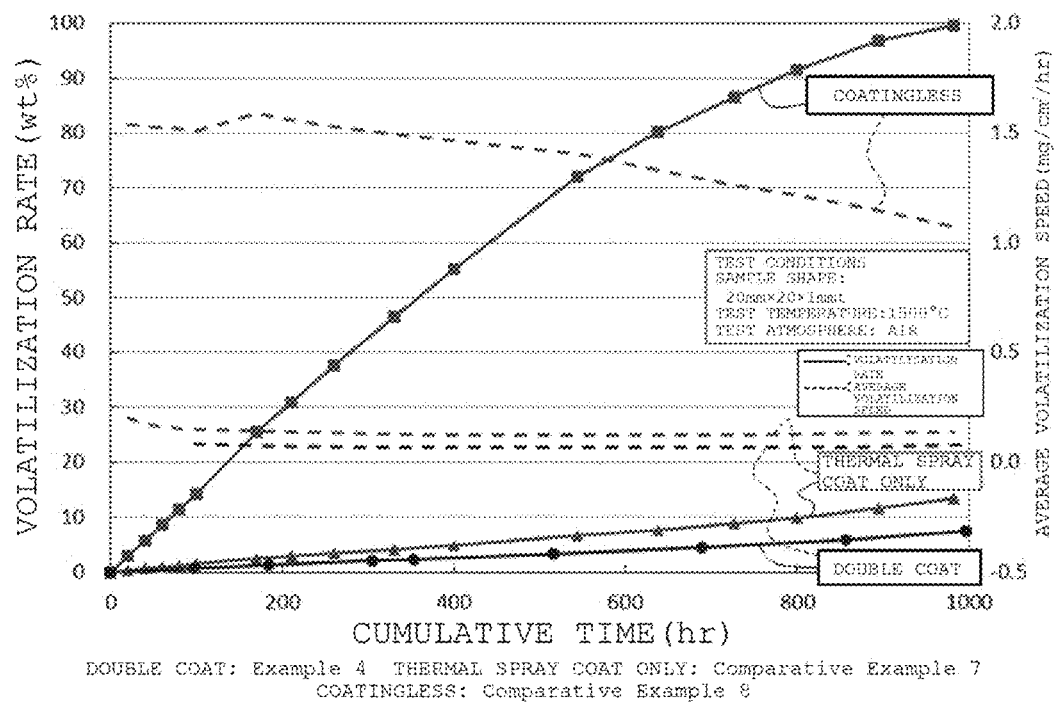
FIG. 37 is a graph showing a relationship of a volatilization rate and an average volatilization speed with respect to a cumulative time of a volatilization test (Example 4, Comparative Example 7, and Comparative Example 8).

A relationship between the volatilization rate and the average volatilization speed with respect to the volatilization test time is shown in FIG. 37. In FIG. 37, Double coat is Example 4, Thermal spray coat only is Comparative Example 7, and Coatingless is Comparative Example 8. As is obvious from the results of FIG. 37, in Example 4, oxidative volatilization was satisfactorily suppressed. On the other hand, in Comparative Example 7, since there was not any layer present on the first layer, suppression of the oxidative volatilization was not sufficient. In Comparative Example 8, since a coating layer was not present at all, suppression of the oxidative volatilization was not satisfactory.

REFERENCE SIGNS LIST

100 VOLATILIZATION SUPPRESSING COMPONENT
101 METALLIC BASE MATERIAL
102 FIRST LAYER
103 SECOND LAYER
104 LAMINATED FILM
105 PENETRATION CURVE PART
106 ANCHOR
107 SURFACE AUXILIARY LINE
108 THROUGH CRACK
109 SEALED CRACK

The invention claimed is:

1. A volatilization suppressing component comprising:
a metallic base material; and
a laminated film having at least a first layer formed on a portion or the entirety of a surface of the metallic base material, and a second layer formed on the first layer,
wherein the first layer is an adhesive layer between the metallic base material and the second layer, in which the adhesive layer has an average porosity of less than 5%; and wherein the second layer is a porous protective layer for the first layer, in which the porous protective layer has an average porosity of 10% or high and 50% or lower; and
wherein an average particle size in the first layer is lager than an average particle size in the second layer.

2. The volatilization suppressing component according to claim 1, wherein the first layer is denser than the second layer.

3. The volatilization suppressing component according to claim 1, wherein the average particle size in the first layer is more than 2 μm and 20 μm or less, and the average particle size in the second layer is 0.5 μm or more and 2 μm or less.

4. The volatilization suppressing component according to claim 1, wherein an average thickness of the first layer is 50 μm or more and 150 μm or less, and an average thickness of the second layer is 30 μm or more and 65 μm or less.

5. The volatilization suppressing component according to claim 1, wherein the metallic base material has anchors at a vertical cross-section representing a thickness of the base material, and an average cross-sectional area per anchor is 300 μm² or more.

6. The volatilization suppressing component according to claim 5, wherein in the vertical cross-section, constituent particles of the first layer occupy 85% or more of the cross-sectional area of the anchors.

7. The volatilization suppressing component according to claim 1, wherein the laminated film is an oxide containing any one element of zirconium, silicon, aluminum, hafnium, calcium, magnesium, beryllium, thorium, or yttrium as a main component, or a composite oxide of these.

8. The volatilization suppressing component according to claim 1, wherein the first layer and the second layer contain the same oxide as a main component.

9. The volatilization suppressing component according to claim 1, wherein a material of the metallic base material is platinum, a platinum alloy, iridium, or an iridium alloy.

10. A method for manufacturing the volatilization suppressing component according to claim 1, the method comprising:
   a step of forming the first layer on the surface of the metallic base material by a thermal spraying method; and
   a step of forming the second layer by performing, at least once, a process of forming a liquid layer on a surface of the first layer and of drying and solidifying the liquid layer.

11. The method for manufacturing the volatilization suppressing component according to claim 10, wherein in the step of forming the second layer, a colloidal solution layer is formed at least once as the liquid layer.

12. The method for manufacturing the volatilization suppressing component according to claim 10, wherein the liquid layer is formed by brush coating or spray coating.

* * * * *